US012677509B2

(12) United States Patent
Park et al.

(10) Patent No.: US 12,677,509 B2
(45) Date of Patent: Jul. 7, 2026

(54) DISPLAY DEVICE INCLUDING INSULATING LAYER ON LIGHT-EMITTING ELEMENTS

(71) Applicant: SAMSUNG DISPLAY CO., LTD., Yongin-si (KR)

(72) Inventors: No Kyung Park, Hwaseong-si (KR); Hyun Wook Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 691 days.

(21) Appl. No.: 17/559,893

(22) Filed: Dec. 22, 2021

(65) Prior Publication Data

US 2022/0223761 A1 Jul. 14, 2022

(30) Foreign Application Priority Data

Jan. 8, 2021 (KR) ........................ 10-2021-0002406

(51) Int. Cl.
$H10H\ 20/831$ (2025.01)
$H10H\ 20/857$ (2025.01)
(Continued)

(52) U.S. Cl.
CPC ...... *H10H 20/8312* (2025.01); *H10H 20/857* (2025.01); *H10H 29/142* (2025.01); *H10W 90/00* (2026.01)

(58) Field of Classification Search
CPC .............. H01L 25/167; H01L 25/0753; H01L 2933/0016; H01L 33/38; H01L 33/36;
(Continued)

(56) References Cited

U.S. PATENT DOCUMENTS 9,329,433 B2 * 5/2016 Negishi ............... H10H 20/831
10,026,777 B2 7/2018 Kang et al.
(Continued)

FOREIGN PATENT DOCUMENTS

CN         108206228 A     6/2018
KR   10-2019-0031404 A     3/2019
(Continued)

OTHER PUBLICATIONS

Search Report dated Apr. 14, 2022 for corresponding Korean Application No. PCT/KR2022/000020 (3 pages).
(Continued)

*Primary Examiner* — Sophia T Nguyen
(74) *Attorney, Agent, or Firm* — Womble Bond Dickinson (US) LLP

(57) ABSTRACT

A includes an emission area and a subsidiary area spaced from the emission area in a first direction, a first electrode in the emission area and extending in the first direction, and a second electrode spaced from the first electrode in a second direction, the second electrode extending in the first direction, a first insulating layer on the first electrode and the second electrode, a plurality of light-emitting elements on the first insulating layer and having at least one end on the first electrode or the second electrode, a second insulating layer on the plurality of light-emitting elements and including a first pattern portion extending in the first direction and a first base portion in the subsidiary area, and a first connection electrode on the first electrode and in contact with the light-emitting elements, and a second connection electrode on the second electrode and in contact with the light-emitting elements.

11 Claims, 26 Drawing Sheets

(51) Int. Cl.
H10H 29/14 (2025.01)
H10W 90/00 (2026.01)

(58) Field of Classification Search
CPC ......... H01L 33/62; H01L 33/44; H01L 33/52;
H01L 33/54; H10H 20/84; H10H 20/852;
H10H 20/853; H10H 20/00; H10H
20/036; H10H 20/0362; H10H 20/013;
H10H 20/0133; H10H 20/01335; H10H
20/0137; H10H 20/062; H10H 20/052;
H10H 20/824; H10H 29/142; H10H
29/14; H10H 29/10; H10H 29/20; H10H
29/24; H10H 29/39; H10H 29/832; H10H
29/8321; H10H 29/34; H10K 59/123;
H10K 59/80515; H10K 59/8051; H10K
59/80521
See application file for complete search history.

(56) References Cited

U.S. PATENT DOCUMENTS

| | | | |
|---|---|---|---|
| 10,269,865 B2 | 4/2019 | Kang et al. | |
| 10,665,633 B2 | 5/2020 | Kang et al. | |
| 10,763,311 B2 | 9/2020 | Kim | |
| 11,050,001 B2 * | 6/2021 | Ko | G09G 3/3426 |
| 11,088,197 B2 | 8/2021 | Kang et al. | |
| 11,101,257 B2 * | 8/2021 | Kim | H01L 27/1248 |
| 11,152,424 B2 * | 10/2021 | Li | H01L 27/156 |
| 11,271,032 B2 * | 3/2022 | Lee | H01L 25/0753 |
| 11,387,223 B2 * | 7/2022 | Woo | H01L 25/167 |
| 11,411,044 B2 * | 8/2022 | Cho | H10H 29/142 |
| 11,610,934 B2 | 3/2023 | Kang et al. | |
| 11,705,540 B2 * | 7/2023 | Chang | H01L 33/382 |
| | | | 257/88 |
| 11,811,010 B2 * | 11/2023 | Chang | H01L 25/0753 |
| 11,908,848 B2 * | 2/2024 | Lee | H01L 25/0753 |
| 11,916,178 B2 * | 2/2024 | Kwag | H01L 33/382 |
| 11,935,988 B2 * | 3/2024 | Kang | H01L 25/0753 |
| 11,961,950 B2 * | 4/2024 | Kim | H10H 20/8316 |
| 11,978,834 B2 | 5/2024 | Li et al. | |
| 11,978,835 B2 * | 5/2024 | Kim | H01L 33/54 |
| 11,990,566 B2 * | 5/2024 | Oh | H01L 33/382 |
| 12,074,264 B2 * | 8/2024 | Kim | H10H 20/853 |
| 12,087,884 B2 * | 9/2024 | Do | H10H 20/819 |
| 12,155,021 B2 * | 11/2024 | Lee | H01L 25/167 |
| 12,166,022 B2 * | 12/2024 | Li | H01L 25/0753 |
| 12,283,604 B2 | 4/2025 | Kang et al. | |
| 12,324,312 B2 | 6/2025 | Kim et al. | |
| 12,408,494 B2 | 9/2025 | Oh et al. | |
| 2009/0102753 A1 | 4/2009 | Yamashita et al. | |
| 2018/0012876 A1 * | 1/2018 | Kim | H01L 33/387 |
| 2018/0019369 A1 * | 1/2018 | Cho | H01L 33/38 |
| 2018/0175009 A1 * | 6/2018 | Kim | H01L 25/0753 |
| 2018/0175104 A1 * | 6/2018 | Kang | H10H 29/10 |
| 2018/0198018 A1 * | 7/2018 | Kim | H01L 25/0753 |
| 2018/0301504 A1 * | 10/2018 | Kang | F21K 9/68 |
| 2019/0086740 A1 | 3/2019 | Bae et al. | |
| 2019/0172819 A1 * | 6/2019 | Bae | H10H 20/819 |
| 2019/0326348 A1 * | 10/2019 | Im | H01L 27/156 |
| 2019/0378953 A1 * | 12/2019 | Min | H01L 27/156 |
| 2020/0013766 A1 * | 1/2020 | Kim | H01L 25/167 |
| 2020/0028046 A1 | 1/2020 | Kim et al. | |
| 2020/0043976 A1 * | 2/2020 | Kim | H10H 20/856 |
| 2020/0066699 A1 * | 2/2020 | Kim | H01L 25/0753 |
| 2020/0144453 A1 * | 5/2020 | Chang | H01L 27/124 |
| 2020/0152835 A1 * | 5/2020 | Ko | H01L 33/38 |
| 2020/0161286 A1 * | 5/2020 | Park | H01L 25/167 |
| 2020/0176656 A1 * | 6/2020 | Bae | H01L 25/0753 |
| 2020/0203587 A1 * | 6/2020 | Kim | H10H 29/142 |
| 2020/0258938 A1 * | 8/2020 | Chai | H01L 33/62 |
| 2020/0273397 A1 * | 8/2020 | Jeong | H01L 25/0753 |
| 2020/0273906 A1 * | 8/2020 | Li | H01L 33/38 |

| | | | |
|---|---|---|---|
| 2020/0403131 A1 * | 12/2020 | Kim | H01L 33/20 |
| 2021/0066561 A1 * | 3/2021 | Chang | H10D 86/40 |
| 2021/0091050 A1 * | 3/2021 | Heo | H01L 33/44 |
| 2021/0134877 A1 * | 5/2021 | Kim | H01L 27/156 |
| 2021/0167253 A1 * | 6/2021 | Basrur | H01L 33/62 |
| 2021/0183826 A1 * | 6/2021 | Chang | G09G 3/3225 |
| 2021/0202451 A1 * | 7/2021 | Kong | H01L 33/0095 |
| 2021/0217738 A1 * | 7/2021 | Bae | H01L 33/62 |
| 2021/0242381 A1 * | 8/2021 | Lee | H01L 33/62 |
| 2021/0249392 A1 * | 8/2021 | Woo | H01L 33/62 |
| 2021/0249575 A1 * | 8/2021 | Lee | H01L 25/167 |
| 2021/0257349 A1 * | 8/2021 | Yang | H01L 24/82 |
| 2021/0265329 A1 * | 8/2021 | Woo | H01L 33/62 |
| 2021/0272938 A1 * | 9/2021 | Chang | H01L 25/0753 |
| 2021/0272943 A1 * | 9/2021 | Lee | H01L 27/124 |
| 2021/0280753 A1 * | 9/2021 | Kim | H01L 33/0095 |
| 2021/0288033 A1 * | 9/2021 | Lim | H01L 33/08 |
| 2021/0288104 A1 * | 9/2021 | Yang | H01L 25/0753 |
| 2021/0288220 A1 * | 9/2021 | Oh | H01L 25/167 |
| 2021/0305222 A1 * | 9/2021 | Min | H01L 25/167 |
| 2021/0313498 A1 * | 10/2021 | Kim | H01L 29/78633 |
| 2021/0320237 A1 * | 10/2021 | Kim | H01L 25/167 |
| 2021/0327954 A1 * | 10/2021 | Cho | H01L 33/38 |
| 2021/0335892 A1 * | 10/2021 | Lee | H10K 59/124 |
| 2021/0359166 A1 * | 11/2021 | Jung | H01L 33/005 |
| 2021/0366888 A1 * | 11/2021 | Kim | H01L 25/167 |
| 2021/0367024 A1 * | 11/2021 | Kim | H10K 59/123 |
| 2021/0376192 A1 * | 12/2021 | Yun | H01L 33/24 |
| 2021/0376210 A1 * | 12/2021 | Lee | H10H 20/853 |
| 2021/0384178 A1 * | 12/2021 | Lee | H01L 25/0753 |
| 2021/0391380 A1 * | 12/2021 | Li | H01L 33/62 |
| 2022/0029058 A1 * | 1/2022 | Kim | H01L 33/385 |
| 2022/0052107 A1 * | 2/2022 | Lee | H01L 25/0753 |
| 2022/0052228 A1 * | 2/2022 | Yang | H01L 33/44 |
| 2022/0069004 A1 * | 3/2022 | Kang | H01L 25/0753 |
| 2022/0085249 A1 * | 3/2022 | Do | H10H 20/8316 |
| 2022/0140186 A1 | 5/2022 | Min et al. | |
| 2022/0149111 A1 * | 5/2022 | Lee | H01L 25/0753 |
| 2022/0181382 A1 * | 6/2022 | Park | H01L 27/156 |
| 2022/0199598 A1 * | 6/2022 | Kim | H01L 25/167 |
| 2022/0199870 A1 * | 6/2022 | Kim | H01L 33/38 |
| 2022/0216179 A1 | 7/2022 | Yang et al. | |
| 2022/0223761 A1 * | 7/2022 | Park | H01L 33/62 |
| 2022/0238758 A1 * | 7/2022 | Song | H01L 33/382 |
| 2022/0262984 A1 * | 8/2022 | Choi | H10H 20/8312 |
| 2022/0302354 A1 * | 9/2022 | Kim | H01L 33/387 |
| 2022/0384684 A1 * | 12/2022 | Lee | H01L 25/0753 |
| 2022/0399398 A1 * | 12/2022 | Kim | H01L 25/0753 |
| 2022/0406840 A1 * | 12/2022 | Lee | H01L 33/44 |
| 2023/0065735 A1 * | 3/2023 | Chang | H01L 33/38 |
| 2023/0106399 A1 * | 4/2023 | Lee | H10H 20/821 |
| | | | 257/79 |
| 2023/0343899 A1 * | 10/2023 | Lee | H10H 20/8312 |
| 2024/0313164 A1 | 9/2024 | Oh et al. | |
| 2024/0363819 A1 * | 10/2024 | Im | H10H 20/831 |

FOREIGN PATENT DOCUMENTS

| | | | |
|---|---|---|---|
| KR | 10-2019-0062808 A | 6/2019 | |
| KR | 20200034896 A | 4/2020 | |
| KR | 10-2020-0072162 A | 6/2020 | |
| KR | 10-2020-0086790 A | 7/2020 | |
| KR | 2020-0077671 | 7/2020 | |
| KR | 2020-0102615 | 9/2020 | |
| KR | 10-2020-0138479 A | 12/2020 | |
| KR | 10-2021-0057891 A | 5/2021 | |
| TW | 202013713 A | 4/2020 | |
| WO | WO-2020017712 A1 * | 1/2020 | ......... H01L 25/0753 |
| WO | WO 2020/213822 A1 | 10/2020 | |

OTHER PUBLICATIONS

Written Opinion dated Apr. 14, 2022 for corresponding Korean Application No. PCT/KR2022/000020 (3 pages).

* cited by examiner

RME: RME1, RME2

CNE: CNE1, CNE2

BNL1: BN1, BN2
PAS2: PT1, PT2

BNL1: BN1, BN2
PAS2: PT1, BP1, BP2

BNL1_1: BNL1, BNL2, BNL3
RME_1: RME1, RME2, RME3
CNE_1: CNE1, CNE2, CNE3
PAS2_1: BP1, BP2, SP1,
         PT1, PT2, BR1, BR2

PAS2_1: PT1, PT2, SP1,
         BR1, BR2, BP1, BP2
RME_1: RME1, RME2, RME3

10_2

CTD
CTS
SPXn
CN_B2
CN_E4 ⟩CNE4
CN_E3
A3
BN1
BNL2
ED3
ED4
CN_E2
CN_E5
CNE3⟨ CN_B1
CN_B3 ⟩CNE5
CN_E1
CN_E6
A4
ED1
ED2
BN3
BN2
Q4◄
►Q4'  PAS2_2
RME1
CNE2
CNE1
RME4
RME3
RME2
EMA
A5
CT1
CT4
CT3
CT2
ROP
SA

DR1

DR2

BNL1_2: BN1, BN2, BN3
RME_2: RME1, RME2, RME3, RME4
CNE_2: CNE1, CNE2, CNE3, CNE4, CNE5

10_2

SPXn

BN1
CNE3
PT3

ED3
BR3

BR1

ED1
PT1

CNE1

BR4
CNE4
SP1
PT4
BNL2
ED4
BR5
CNE5
BR2

ED2
BN3
BN2

CNE2
BP2

EMA
PT2

CT1
CT3
ROP

CT4
CT2
BP1
SA

DR1
DR2

PAS2_2: BP1, BP2, SP1,
PT1, PT2, BR1, BR2

PAS2_2: PT1, PT2, SP1, BP2
RME_2: RME1, RME2, RME3, RME4

DR1

DR2

BNL1_3: BN1, BN2, BN3
RME_3: RME1, RME2, RME3, RME4
CNE_3: CNE1, CNE2, CNE3
PAS2_3: BP1, SP1, SP2, SP3
          PT1, PT2, PT3, PT4
          BR1, BR2, BR3, BR4, BR5, BR6

PAS2_3: PT1, PT2, SP1, BP2
RME_3: RME1, RME2, RME3, RME4

10_4

CTD — CTS
— SPXn
BR6 — BR4
— CNE4
BN1

PT3 — SP1
— PT4
— BNL2
ED3 — ED4
CNE3 — CNE5
BR3 — BR5

— BR2
BR1 — SP3
SP2 — ED2
ED1 — BN3
PT1 — BN2
Q6 — Q6'
RME1 — SP1
CNE1 — CNE2
RME3 — RME4
— RME2
— EMA
— PT2

CT1 — CT4
CT3 — CT2
ROP — BP1
— SA

Q7   Q7'

DR1
DR2

BNL1_4: BN1, BN2, BN3
RME_4: RME1, RME2, RME3, RME4
CNE_4: CNE1, CNE2, CNE3
PAS2_4: BP1, SP1, SP2, SP3
        PT1, PT2, PT3, PT4
        BR1, BR2, BR3, BR4, BR5, BR6

PAS2_4: PT1, PT2, SP1, BP2
RME_4: RME1, RME2, RME3, RME4

BNL1_5: BN1, BN2, BN3
RME_5: RME1, RME2, RME3, RME4
CNE_5: CNE1, CNE2, CNE3, CNE4, CNE5

DISPLAY DEVICE INCLUDING INSULATING LAYER ON LIGHT-EMITTING ELEMENTS

CROSS-REFERENCE TO RELATED APPLICATION

This application claims priority to and the benefit of Korean Patent Application No. 10-2021-0002406 filed on Jan. 8, 2021 in the Korean Intellectual Property Office, the entire content of which is incorporated by reference herein.

BACKGROUND

1. Field

The disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices include a display panel such as an organic light-emitting display panel and a liquid-crystal display panel for displaying images. Among them, a light-emitting display panel may include light-emitting elements. For example, light-emitting diodes (LEDs) may include an organic light-emitting diode using an organic material as a luminescent material or an inorganic light-emitting diode using an inorganic material as a luminescent material.

SUMMARY

Aspects and features of embodiments of the present disclosure provide a display device that can prevent delamination of an insulating layer disposed on light-emitting elements.

Aspects and features of embodiments of the present disclosure are not limited to the above-mentioned aspects and features, and other aspects and features of the present disclosure will be apparent to those skilled in the art from the following descriptions.

According to an embodiment of the present disclosure, a display device may have a structure that prevents delamination of an insulating layer that fixes the light-emitting elements even if the insulating layer has a thin line width compared to the length. The insulating layer may include pattern portions for fixing light-emitting elements, support patterns having a width greater than that of the pattern portions, and bridge portions. The display device may have a structure that prevents portions of the insulating layer on the light-emitting elements from being delaminated during a subsequent process after the insulating layer has been formed, so that it is possible to prevent the light-emitting elements and the portions of the insulating layer from being delaminated or separated and remaining as particles.

According to an embodiment of the disclosure, a display device includes an emission area and a subsidiary area spaced from the emission area in a first direction, a first electrode in the emission area and extending in the first direction, and a second electrode spaced from the first electrode in a second direction crossing the first direction, the second electrode extending in the first direction, a first insulating layer on the first electrode and the second electrode, a plurality of light-emitting elements on the first insulating layer and having at least one end on the first electrode or the second electrode, a second insulating layer on the plurality of light-emitting elements and including a first pattern portion extending in the first direction and a first base portion in the subsidiary area, and a first connection electrode on the first electrode and in contact with the light-emitting elements, and a second connection electrode on the second electrode and in contact with the light-emitting elements, wherein the first pattern portion extends from the emission area to the subsidiary area and connected to the first base portion.

The display device may further include a first bank including a plurality of bank portions extending in the first direction in the emission area, and a second bank around the emission area and the subsidiary area, wherein the second insulating layer may further includes a second base portion on the second bank and connected to the first base portion and the first pattern portion.

The first connection electrode and the second connection electrode may be located across the emission area and the subsidiary area, and wherein the first pattern portion may be extended in the first direction between the first connection electrode and the second connection electrode and connected to the first base portion.

The first connection electrode and the second connection electrode may be in contact with both sides of the first pattern portion, and wherein a width of the first pattern portion may be smaller than a length of the plurality of light-emitting elements.

The display device may further include a third electrode between the first electrode and the second electrode and extending in the first direction, wherein the plurality of light-emitting elements may include first light-emitting elements on the first electrode and the third electrode, and second light-emitting elements on the third electrode and the second electrode, wherein the first pattern portion of the second insulating layer may be on the first light-emitting elements, and wherein the second insulating layer may further include a second pattern portion on the second light-emitting elements, and a first support pattern portion on the third electrode.

The second insulating layer may further include a first bridge portion extending in the second direction and connected to the first pattern portion and the second base portion, and a second bridge portion extending in the second direction and connected to the second pattern portion and the first support pattern portion, and wherein a width the first bridge portion and the second bridge portion measured in the first direction may be greater than a width of the first pattern portion and the second pattern portion measured in the second direction.

The first support pattern portion may be extended in the first direction on the third electrode, and wherein a width of the first support pattern portion measured in the second direction may be greater than the width of the first bridge portion and the second bridge portion measured in the second direction.

Each of the plurality of bank portions of the first bank may have a length that is extended in the first direction and is longer than the emission area, wherein a portion of the second bank between the emission area and the subsidiary area may overlap with the plurality of bank portions in a thickness direction of the display device, and the second base portion may be not on a portion of the second bank that overlaps with the bank portions.

The display device may further include a third electrode between the first electrode and the second electrode, a fourth electrode spaced from the second electrode in the second direction, a third connection electrode located across the first electrode and the third electrode, a fourth connection electrode located across the third electrode and the fourth electrode, and a fifth connection electrode located across the fourth electrode and the second electrode, wherein the plurality of light-emitting elements may include first light-emitting elements on the first electrode and the third electrode and in contact with the first connection electrode and the third connection electrode, second light-emitting elements on the second electrode and the fourth electrode and in contact with the second connection electrode and the fifth connection electrode, third light-emitting elements on the first electrode and the third electrode and in contact with the third connection electrode and the fourth connection electrode, and fourth light-emitting elements on the second electrode and the fourth electrode and in contact with the fourth connection electrode and the fifth connection electrode.

The first pattern portion of the second insulating layer may be on the first light-emitting elements, and wherein the second insulating layer may further include a second pattern portion on the second light-emitting elements, a third pattern portion on the third light-emitting elements, a fourth pattern portion on the fourth light-emitting elements, a first support pattern portion partially overlapping the second electrode and the third electrode and extending in the first direction, and a plurality of bridge portions extending in the second direction and connected to the first support pattern portion and one of the first, second, third, and fourth pattern portions.

The plurality of bridge portions may include a second bridge portion connecting the second pattern portion with the first support pattern portion, a third bridge portion connecting the third pattern portion with the first support pattern portion, and a fourth bridge portion connecting the fourth pattern portion with the first support pattern portion.

The second insulating layer may further include a second support pattern portion and a third support pattern portion extended in the first direction within the emission area and spaced from each other in the second direction with the first support pattern portion therebetween, wherein the plurality of bridge portions may include a first bridge portion connected to the first pattern portion and the second support pattern portion, wherein a fifth bridge portion connected to the fourth pattern portion and the third support pattern portion, and wherein a sixth bridge portion connected to the third pattern portion and the second support pattern portion.

A width of the first pattern portion of the second insulating layer measured in the second direction may be smaller than a thickness of the first pattern portion.

According to an embodiment of the disclosure, a display device includes a plurality of electrodes extending in a first direction and spaced from each other in a second direction crossing the first direction, the plurality of electrodes including: a first electrode, a second electrode spaced from the first electrode in the second direction, a third electrode between the first electrode and the second electrode, and a fourth electrode spaced from the second electrode in the second direction, a first insulating layer on the plurality of electrodes, a plurality of first light-emitting elements having both ends on the first electrode and the third electrode, and arranged along the first direction, and a plurality of second light-emitting elements having both ends on the second electrode and the fourth electrode, and arranged along the first direction, and a second insulating layer including a first pattern portion on the first light-emitting elements and extending in the first direction, a second pattern portion on the second light-emitting elements and extending in the first direction, and a first support pattern portion partially located on the second electrode and the third electrode and extending in the first direction, wherein the second insulating layer includes a plurality of bridge portions having a shape extending in the second direction and connected to at least one of the first pattern portion, the second pattern portion and the first support pattern portion.

A first width of the first pattern portion and the second pattern portion measured in the second direction may be smaller than lengths of the plurality of first light-emitting elements and the plurality of second light-emitting elements, a second width of the plurality of bridge portions measured in the first direction may be greater than the first width of the first pattern portion and the second pattern portion, and wherein a third width of the first support pattern portion measured in the second direction may be greater than the second width of the plurality of bridge portions measured in the first direction.

A thickness of the first pattern portion and the second pattern portion may be greater than the first width of the first pattern portion and the second pattern portion.

The display device may be further include a first bank overlapping the plurality of electrodes and including a plurality of bank portions extending in the first direction, and a second bank surrounding an emission area, the plurality of first and second light-emitting elements being located in the emission area, and a subsidiary area being spaced from the emission area in the first direction, wherein the second insulating layer may further include a first base portion in the subsidiary area and a second base portion on the second bank, and wherein each of the first pattern portion and the second pattern portion may extends from the emission area to the subsidiary area and may be connected to the first base portion.

The second insulating layer may further include a first bridge portion extending in the second direction and connected to the first pattern portion and the second base portion.

The second insulating layer may further include a third pattern portion spaced from the first pattern portion in the first direction, a fourth pattern portion spaced from the second pattern portion in the first direction, and a second support pattern portion and a third support pattern portion extending in the first direction and spaced from each other in the second direction with the first support pattern portion therebetween, and the plurality of bridge portions may include a first bridge portion connected to the first pattern portion and the second support pattern portion, a second bridge portion connected to the second pattern portion and the first support pattern portion, a third bridge portion connected to the third pattern portion and the first support pattern portion, and a fourth bridge portion connected to the fourth pattern portion and the first support pattern portion.

The plurality of bridge portions may further include a fifth bridge portion connected to the fourth pattern portion and the third support pattern portion, and a sixth bridge portion connected to the third pattern portion and the second support pattern portion.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

The present disclosure will now be described more fully hereinafter with reference to the accompanying drawings, in which embodiments of the present disclosure are shown. The present disclosure may, however, be embodied in different forms and may not be construed as limited to the embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements may not be limited by these terms. These terms are only used to distinguish one element from another element. For instance, a first element discussed below could be termed a second element without departing from the teachings of the present disclosure. Similarly, the second element could also be termed the first element.

Hereinafter, embodiments of the present disclosure will be described with reference to the accompanying drawings.

Figure 1:
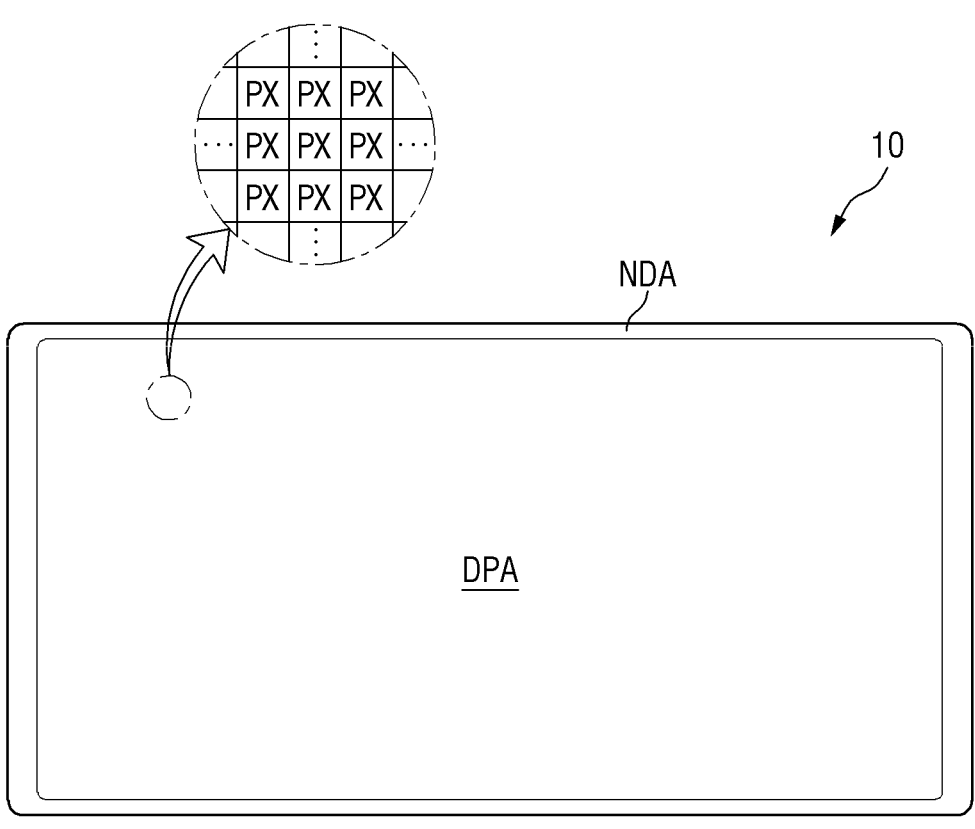
FIG. 1 is a plan view of a display device according to an embodiment of the disclosure.
Figure 1:
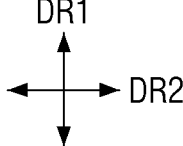

FIG. 1 is a plan view of a display device according to an embodiment of the disclosure.

Referring to FIG. 1, the display device 10 displays a moving image and/or a still image. A display device 10 may refer to any electronic device that provides a display screen. For example, the display device 10 may include a television set, a laptop computer, a monitor, an electronic billboard, the Internet of Things (IoT) devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the present disclosure is not limited thereto. Any other display panel may be employed as long as the spirit and scope of the present disclosure can be equally applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. In the example shown in FIG. 1, the display device 10 has a rectangular shape with the longer sides in a second direction DR2.

The display device 10 may include the display area DPA and a non-display area NDA that is around (e.g., surrounding) the display area DA along the edge or periphery of the display area DA. In the display area DPA, images can be displayed. In the non-display area NDA, images are not displayed. The display area DPA may be referred to as an active area, while the non-display area NDA may also be referred to as an inactive (e.g., passive) area. The display area DPA may generally occupy the majority of the center (or the central region) of the display device 10.

The display area DPA may include a plurality of pixels PX. The plurality of pixels PX may be arranged in a matrix. For example, the plurality of pixels PX may be arranged along the rows and columns of a matrix. The shape of each pixel PX may be, but is not limited to, a rectangle or a square when viewed from the top. Each pixel may have a diamond shape having sides inclined with respect to a direction. The pixels PX may be arranged in stripes or a PENTILE® arrangement structure, but the present disclosure is not limited thereto. This PENTILE® arrangement structure may be referred to as an RGBG matrix structure (e.g., a PEN-TILE® matrix structure or an RGBG structure (e.g., a PENTILE® structure)). PENTILE® is a registered trademark of Samsung Display Co., Ltd., Republic of Korea. Each of the pixels PX may include at least one light-emitting element that emits light of a particular wavelength band to real color.

The non-display area NDA may be disposed around the display area DPA. The non-display area NDA may be around (e.g., may surround) the display area DPA entirely or partially. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in each of the non-display area NDA, or external devices may be mounted.

Figure 2:
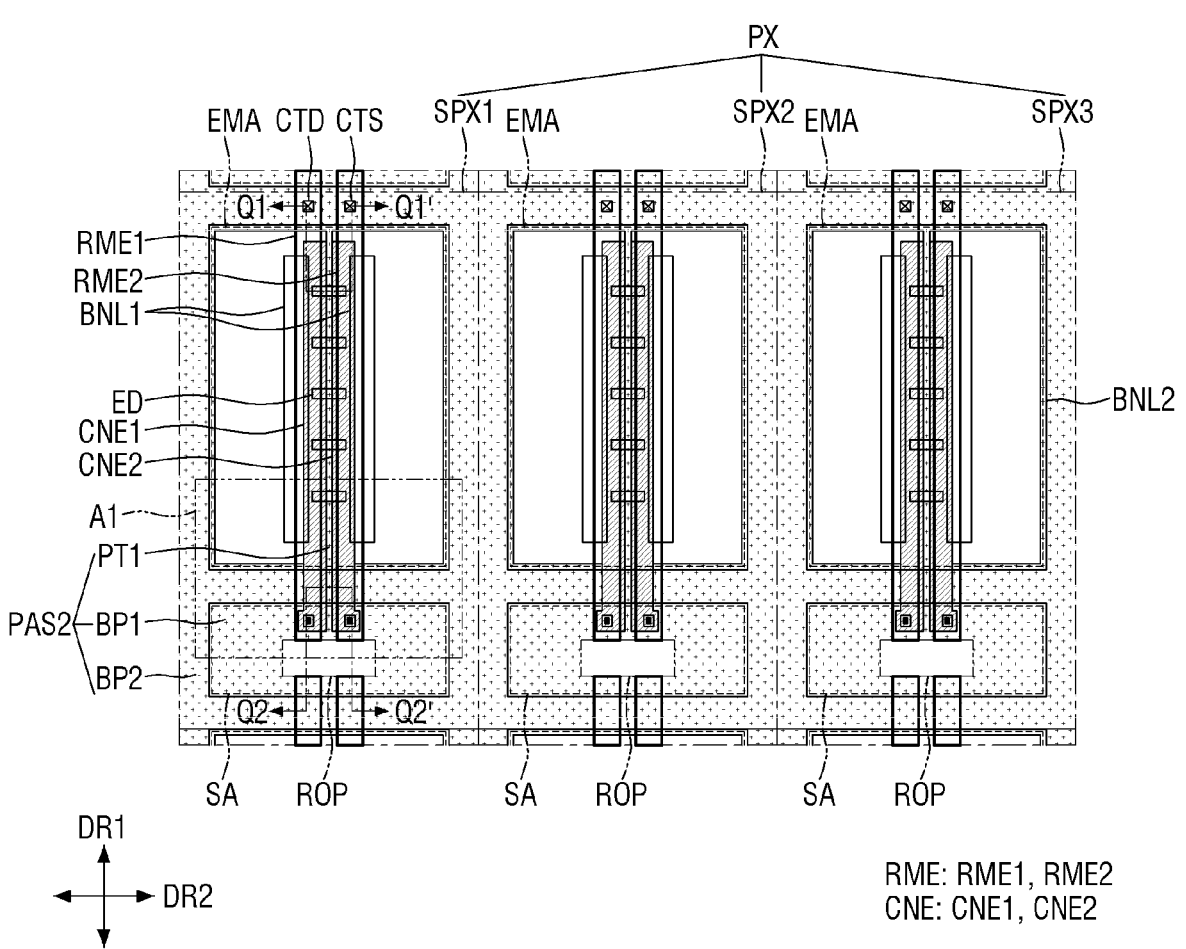
FIG. 2 is a plan view showing a pixel of a display device according to an embodiment of the disclosure.

FIG. 2 is a plan view showing a pixel of a display device according to an embodiment of the disclosure. FIG. 2 shows a pixel PX and a part of another pixel PX adjacent to it in the first direction DR1.

Referring to FIG. 2, each of the plurality of pixels PX of the display device 10 may include a plurality of sub-pixels SPXn, where n is an integer from one to three. For example, a pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, it is to be understood that the present disclosure is not limited thereto. All the sub-pixels SPXn may emit light of the same color. According to an embodiment of the present disclosure, the sub-pixels SPXn may emit blue light. Although the single pixel PX includes three sub-pixels SPXn in the example shown in FIG. 2, the present disclosure is not limited thereto. The pixel PX may include more than three sub-pixels SPXn in one or more other embodiments.

Each of the sub-pixels SPXn of the display device 10 may include an emission area EMA and a non-emission area. In the emission area EMA, the light-emitting diodes ED are disposed to emit light of a particular wavelength band. In the non-emission area, the light-emitting diodes ED are not disposed and the lights emitted from the light-emitting diodes ED do not reach, and thus no light exits therefrom.

The emission area may include an area in which the light-emitting diodes ED are disposed, and may also include an area adjacent to the light-emitting diodes ED where lights emitted from the light-emitting element ED exit. However, it is to be understood that the present disclosure is not limited thereto. The emission area EMA may also include an area in which light emitted from the light-emitting diode ED is reflected or refracted by other elements to exit. The plurality of light-emitting diodes ED may be disposed in each of the sub-pixels SPXn, and the emission area may include the area where the light-emitting elements are disposed and the adjacent area.

Although the emission areas EMA of the sub-pixels SPXn have an uniform area in the example shown in FIG. 2, the present disclosure is not limited thereto. In some embodiments, the emission areas EMA of the sub-pixels SPXn may have different areas depending on a color or wavelength band of light emitted from the light-emitting diodes ED disposed in the respective sub-pixels.

Each of the sub-pixels SPXn may further include a subsidiary area SA disposed in the non-emission area. The subsidiary area SA may be disposed on the lower side of the emission area EMA in the first direction DR1, and may be disposed between the emission areas EMA of the sub-pixels SPXn adjacent to each other in the first direction DR1. For example, the plurality of emission areas EMA and the subsidiary areas SA may be arranged repeatedly along the second direction DR2, and may be arranged alternately along the first direction DR1. However, it is to be understood that the present disclosure is not limited thereto. The emission areas EMA and the subsidiary areas SA of the plurality of pixels PX may have an arrangement different from that of FIG. 2. No light-emitting diode ED is disposed in the subsidiary areas SA and thus no light exits therefrom. The electrodes RME disposed in the sub-pixels SPXn may be partially disposed in the subsidiary areas SA. The electrodes RME disposed in different sub-pixels SPXn may be disposed separately from one another at separation regions ROP of the subsidiary areas SA.

A second bank BNL2 is disposed between the emission areas EMA and the subsidiary areas SA. The second bank BNL2 may be disposed in a lattice pattern on the entire surface of the display area DPA including portions extended in the first direction DR1 and the second direction DR2 when viewed from the top. The second bank BNL2 may be disposed along the border of each of the sub-pixels SPXn to distinguish adjacent sub-pixels SPXn from one another. In addition, the second bank BNL2 may be disposed to be around (e.g., may surround) the emission area EMA disposed in each of the sub-pixels SPXn to distinguish between them. The distances between the emission areas EMA, between the subsidiary areas SA, and between the emission areas EMA and the subsidiary areas SA may vary according to the width of the second bank BNL2.

Figure 3:
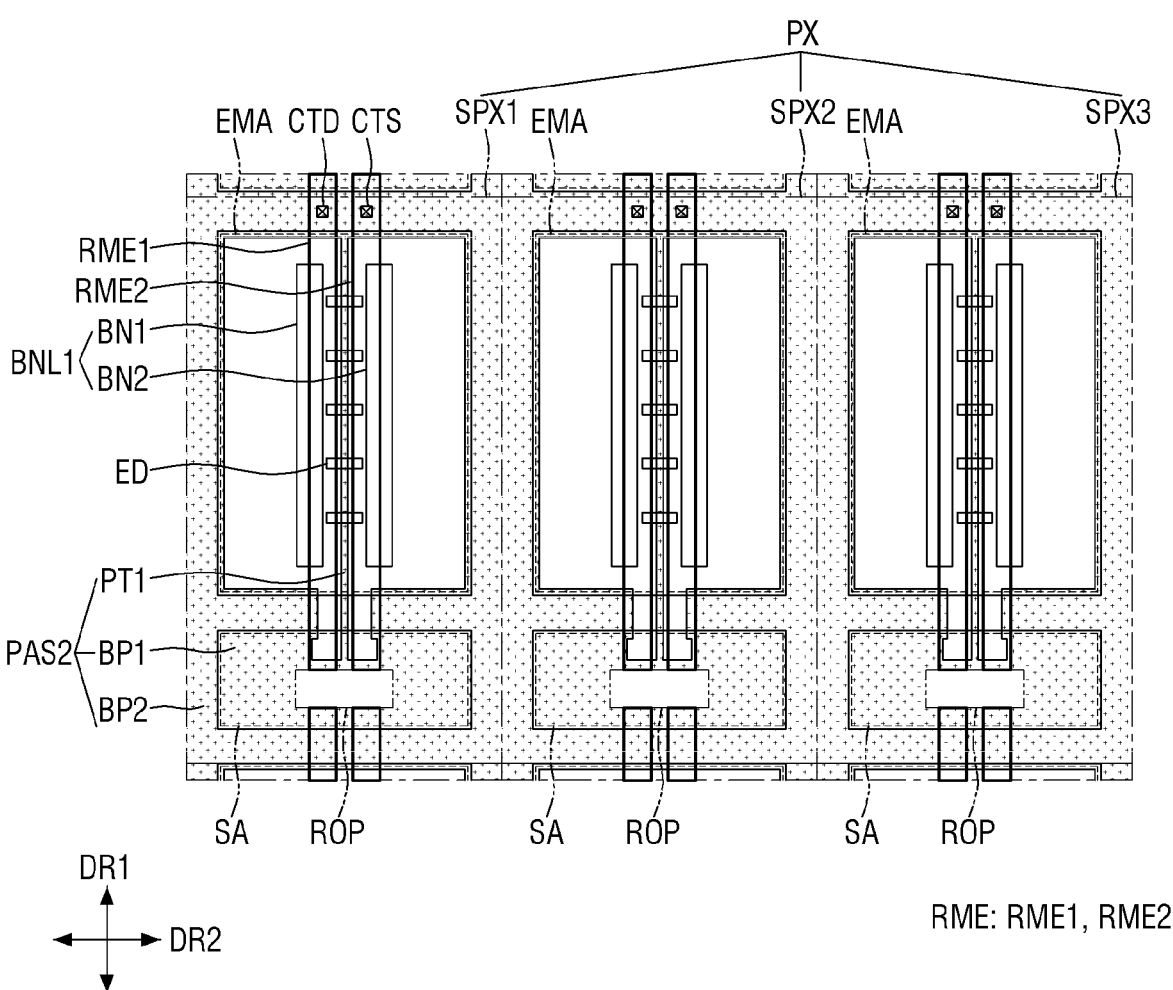
FIG. 3 is a plan view showing relative arrangements of a first bank portion, a second bank portion, a plurality of electrodes, and a second insulating layer disposed in a pixel of FIG. 2.
Figure 4:
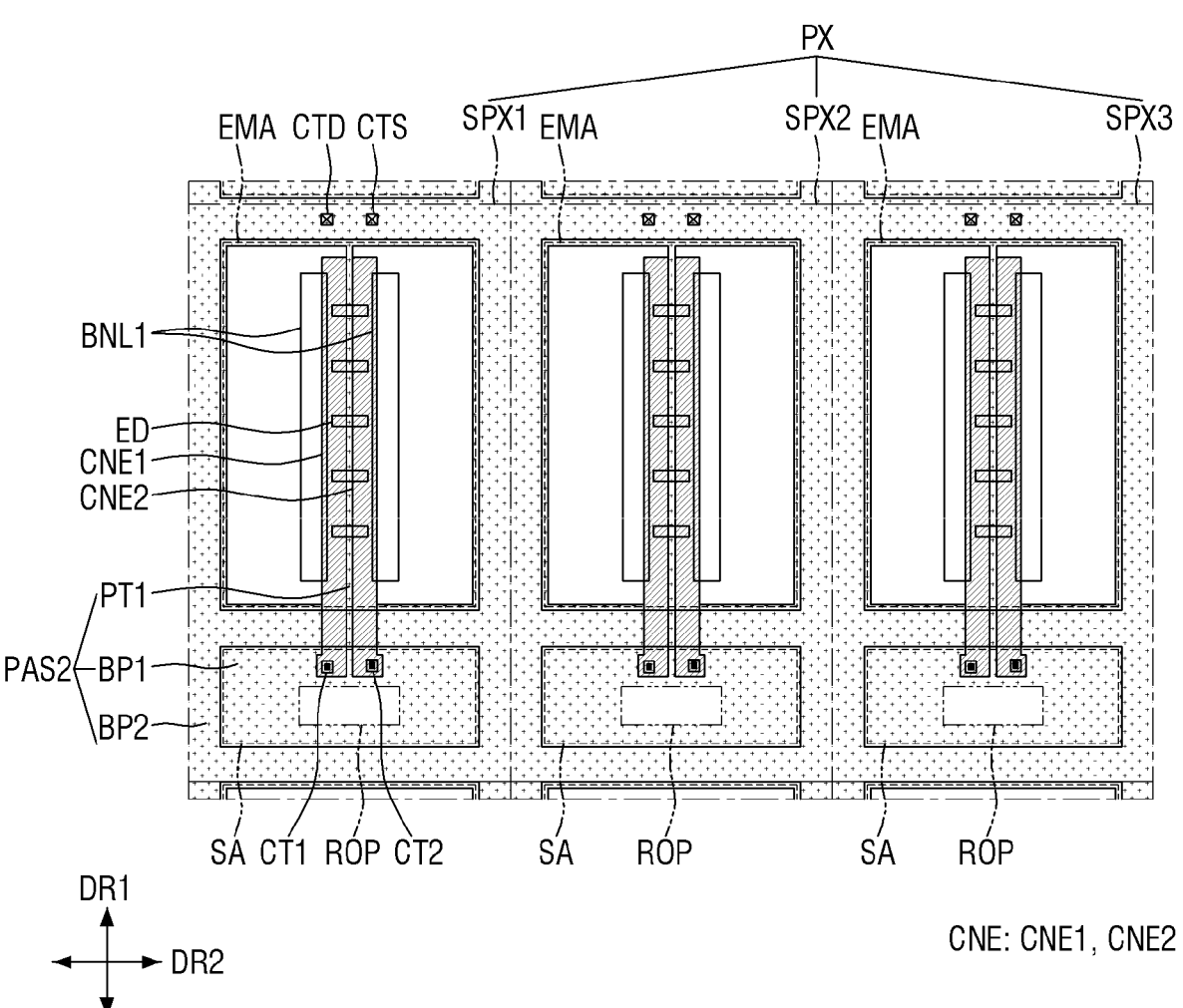
FIG. 4 is a plan view showing relative arrangements of a first bank portion, a second bank portion, a plurality of connection electrodes, and a second insulating layer disposed in a pixel of FIG. 2.
Figure 5:
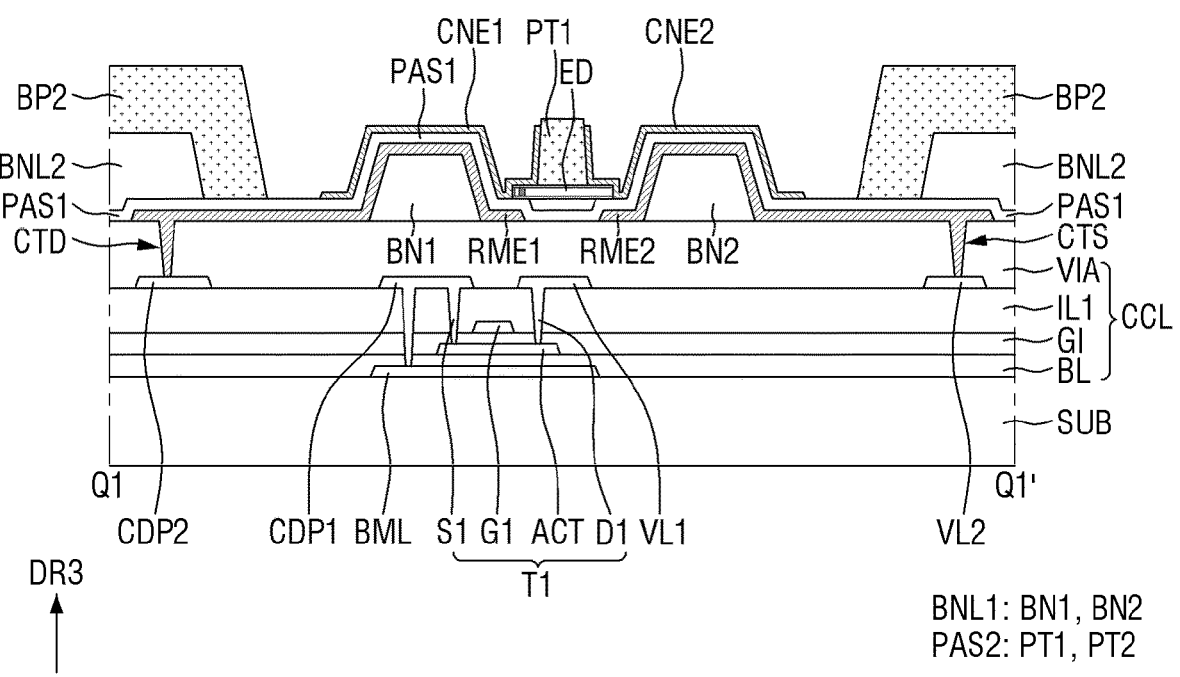
FIG. 5 is a cross-sectional view taken along the line Q1-Q1' of FIG. 2.
Figure 6:
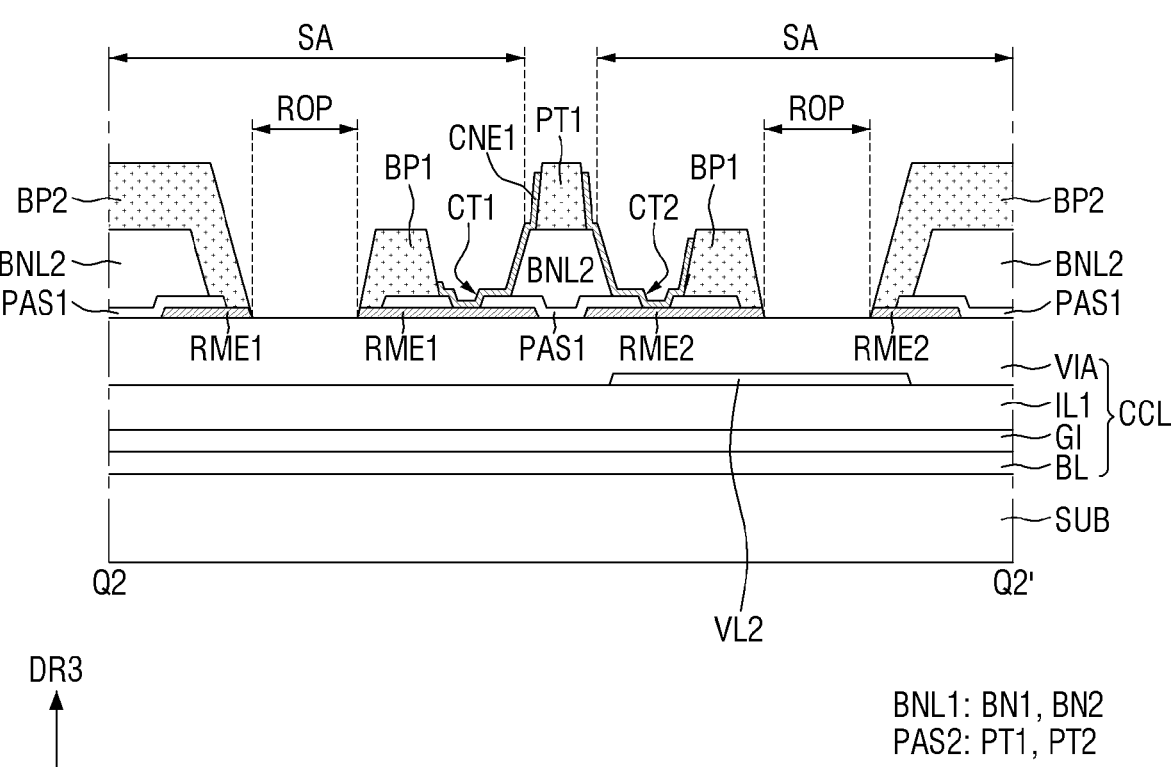
FIG. 6 is a cross-sectional view taken along the line Q2-Q2' of FIG. 2.
Figure 7:
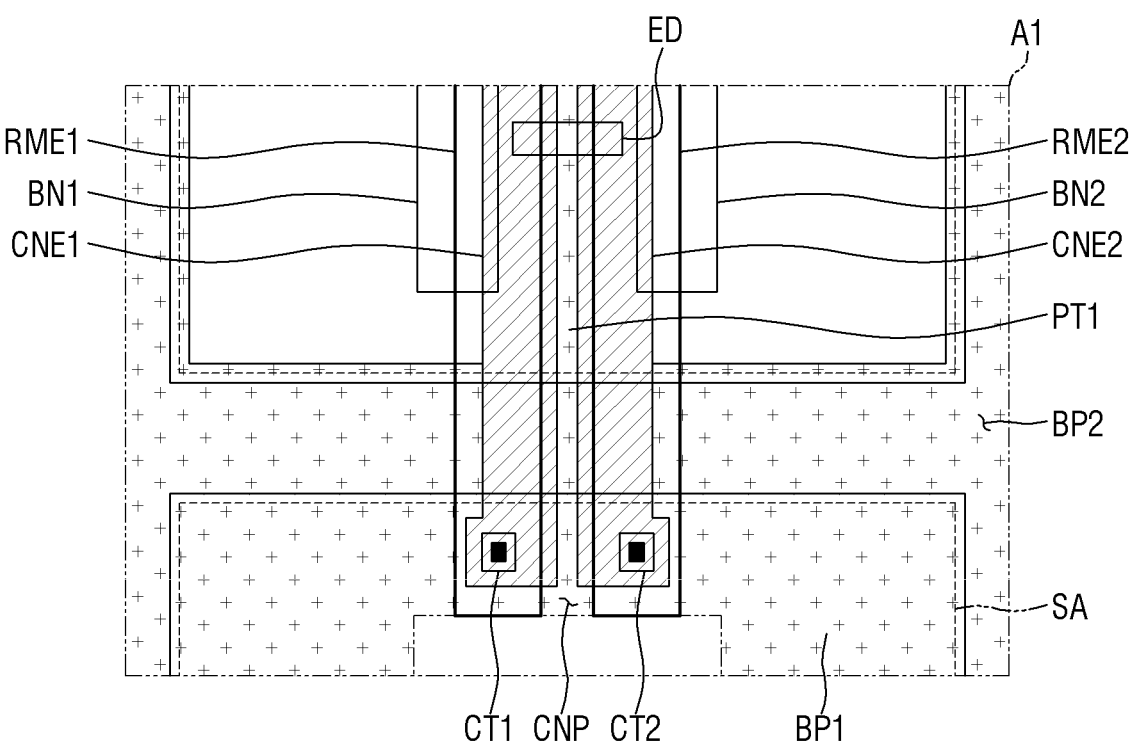
FIG. 7 is an enlarged view of a portion A1 of FIG. 2.

FIG. 3 is a plan view showing relative arrangements of a first bank portion, a second bank portion, a plurality of electrodes, and a second insulating layer disposed in a pixel of FIG. 2. FIG. 4 is a plan view showing relative arrangements of a first bank portion, a second bank portion, a plurality of connection electrodes, and a second insulating layer disposed in a pixel of FIG. 2. FIG. 5 is a cross-sectional view taken along the line Q1-Q1' of FIG. 2. FIG. 6 is a cross-sectional view taken along the line Q2-Q2' of FIG. 2. FIG. 7 is an enlarged view of a portion A1 of FIG. 2.

FIGS. 3 and 4 depict only some of the plurality of layers disposed in one pixel PX. FIG. 5 shows a cross section passing through both ends of a light-emitting diode ED disposed in the first sub-pixel SPX1. FIG. 6 is a view showing a cross section passing through the separation region ROP located in the subsidiary area SA of the first sub-pixel SPX1. FIG. 7 is an enlarged view of a portion between the emission area EMA and the subsidiary area SA.

Referring to FIGS. 3-5 in conjunction with FIG. 2, the display device 10 may include a first substrate SUB, a semiconductor layer disposed on the first substrate SUB, a plurality of conductive layers, and a plurality of insulating layers. The semiconductor layer, the conductive layers, and the insulating layers may form a circuit layer CCL and a display element layer of the display device 10.

For example, the first substrate SUB may be an insulating substrate. The first substrate SUB may be made of an insulating material such as glass, quartz, and a polymer resin. The first substrate SUB may be either a rigid substrate or a flexible substrate that can be bent, folded, or rolled.

A first conductive layer may be disposed on the first substrate SUB. The first conductive layer includes a bottom metal layer BML. The bottom metal layer BML is disposed to overlap an active layer ACT1 of a first transistor T1 in a thickness direction of the first substrate SUB (e.g., a third direction DR3). The bottom metal layer BML may include a material that blocks light, and thus can prevent light from entering the active layer ACT1 of the first transistor T1. In some embodiments, however, the bottom metal layer BML may be eliminated.

A buffer layer BL may be disposed on the bottom metal layer BML and the first substrate SUB. The buffer layer BL may be formed on the first substrate SUB to protect the transistors of the pixel PX from moisture permeating through the first substrate SUB that is susceptible to moisture permeation, and may also provide a flat surface.

The semiconductor layer is disposed on the buffer layer BL. The semiconductor layer may include the active layer ACT of the first transistor T1. The active layer ACT may be disposed to partially overlap with a gate electrode G1 of a second conductive layer, which will be described later, in the third direction DR3.

The semiconductor layer may include polycrystalline silicon, monocrystalline silicon, an oxide semiconductor, etc. In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc.

Although only one first transistor T1 is disposed in the sub-pixel SPXn of the display device 10 in FIG. 5, the present disclosure is not limited thereto. A larger number of transistors may be included in the display device 10.

A first gate insulator GI is disposed on the semiconductor layer and the buffer layer BL. The first gate insulator GI may work as a gate insulating film of the first transistor T1.

The second conductive layer is disposed on the first gate insulator GI. The second conductive layer may include a gate electrode G1 of the first transistor T1. The gate electrode G1 may be disposed so that it overlaps a channel region of the active layer ACT in the thickness direction of the first substrate SUB, e.g., the third direction DR3.

A first interlayer dielectric layer IL1 is disposed on the second conductive layer and the first gate insulator GI. The first interlayer dielectric layer IL1 may work as an insulating film between the second conductive layer and other layers disposed thereon and can protect the second conductive layer.

The third conductive layer is disposed on the first interlayer dielectric layer IL1. The third conductive layer may include a first voltage line VL1, a second voltage line VL2, and a plurality of conductive patterns CDP1 and CDP2.

A high-level voltage (or a first supply voltage) may be applied to the first voltage line VL1 to be transmitted to the first electrode RME1, and a low-level voltage (or a second supply voltage) may be applied to the second voltage line VL2 to be transmitted to the second electrode RME2. A part of the first voltage line VL1 may be in contact with the active layer ACT of the first transistor T1 through a contact hole penetrating the first interlayer dielectric layer IL1 and the first gate insulator GI. The first voltage line VL1 may work as the first drain electrode D1 of the first transistor T1. The second voltage line VL2 may be directly connected to the second electrode RME2 to be described later.

The first conductive pattern CDP1 may be in contact with the active layer ACT of the first transistor T1 through a contact hole penetrating the first interlayer dielectric layer IL1 and the first gate insulator GI. In addition, the first conductive pattern CDP1 may be in contact with the bottom metal layer BML through another contact hole penetrating the first interlayer dielectric layer IL1, the first gate insulator GI, and the buffer layer BL. The first conductive pattern CDP1 may work as a first source electrode S1 of the first transistor T1.

The second conductive pattern CDP2 may be connected to the first electrode RME1 to be described later. In addition, the second conductive pattern CDP2 may be electrically connected to the first transistor T1 through the first conductive pattern CDP1. Although the first conductive pattern CDP1 and the second conductive pattern CDP2 are spaced from each other in FIG. 5, the second conductive pattern CDP2 may be integrated with the first conductive pattern CDP1 to form a single pattern in some embodiments. The first transistor T1 may transmit the first supply voltage applied from the first voltage line VL1 to the first electrode RME1.

Although the first conductive pattern CDP1 and the second conductive pattern CDP2 are formed at the same layer in the drawings, the present disclosure is not limited thereto. In some embodiments, the second conductive pattern CDP2 may be formed as a conductive layer different from the first conductive pattern CDP1, e.g., a fourth conductive layer disposed above the third conductive layer with some insulating layer between the third conductive layer the fourth conductive layer. In such a case, the first voltage line VL1 and the second voltage line VL2 may also be formed as a fourth conductive layer rather than the third conductive layer. The first voltage line VL1 may be electrically connected to the drain electrode D1 of the first transistor T1 through a different conductive pattern.

The buffer layer BL, the first gate insulator GI, and the first interlayer dielectric layer IL1 may be made up of multiple inorganic layers stacked on one another alternately. For example, the buffer layer BL, the first gate insulating layer GI, and the first interlayer dielectric layer IL1 may be made up of a double layer in which inorganic layers including at least one of silicon oxide (SiOx), silicon nitride (SiNx), and silicon oxynitride (SiON) are stacked on one another or multiple layers in which they are alternately stacked on one another. However, it is, to be understood that the present disclosure is not limited thereto. The buffer layer BL, the first gate insulating layer GI and the first interlayer dielectric layer IL1 may be made up of a single inorganic layer including the above-described insulating material. In addition, in some embodiments, the first interlayer dielectric layer IL1 may be made of an organic insulating material such as polyimide (PI).

The second conductive layer and the third conductive layer may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. However, it is to be understood that the present disclosure is not limited thereto.

A via layer VIA is disposed on the third conductive layer. The via layer VIA may include an organic insulating material, e.g., an organic insulating layer material such as polyimide (PI), to provide a flat surface.

A plurality of electrodes RME: RME1 and RME2, a plurality of first banks BNL1 and a second bank BNL2, a plurality of light-emitting diodes ED, and a plurality of connection electrodes CNE: CNE1 and CNE2 are disposed on the via layer VIA as the display elements layer. In addition, a plurality of passivation layers PAS1 and PAS2 may be disposed on the via layer VIA.

The first bank BNL1 may be disposed directly on the via layer VIA. The first bank BNL1 may be disposed in the emission area EMA of the sub-pixel SPXn, may have a shape extending in the first direction DR1, and may be spaced from each other in the second direction DR2. For example, the first bank BNL1 may include a first bank portion BN1 disposed on one side (e.g., the left side) of the center (or central region) of the emission area EMA, and a second bank portion BN2 disposed on the opposite side (e.g., the left side) of the center of the emission area EMA.

The bank portions BN1 and BN2 of the first bank BNL1 may have the same width, but the present disclosure is not limited thereto. Some of the bank portions BN1 and BN2 may have different widths from the other ones of the bank portions BN1 and BN2. The length of the bank portions BN1 and BN2 of the first bank BNL1 extended in the first direction DR1 may be smaller than the length of the emission area EMA in the first direction DR1 surrounded by the second bank portion BNL2. The first bank BNL1 may be disposed in the emission area EMA of each sub-pixel SPXn to form an island-like pattern that has a small width and is extended in one direction on the front surface of the display area DPA. A plurality of light-emitting diodes ED may be disposed between the adjacent bank portions BN1 and BN2 that are spaced from each other.

The first bank BNL1 may have a structure that at least partly protrudes from the upper surface of the via layer VIA. The protruding part of the first bank BNL1 may have inclined or curved side surfaces. Unlike what is shown in FIG. 5, the elements of the first bank BNL1 may have a shape of a semi-circle or semi-ellipse having curved outer surface in the cross-sectional view. The first bank BNL1 may include, but is not limited to, an organic insulating material such as polyimide (PI).

The plurality of electrodes RME has a shape extended in a direction and is disposed in each of the sub-pixels SPXn. The plurality of electrodes RME may be extended in the first direction DR1 to be disposed across the emission area EMA and the subsidiary area SA of the sub-pixel SPXn, and they may be spaced from one another along the second direction DR2. The display device 10 may include a first electrode RME1 and a second electrode RME2 disposed on each of the sub-pixels SPXn. The first electrode RME1 is disposed on the left side of the center (or the central region) of the emission area EMA, and the second electrode RME2 is spaced from the first electrode RME1 in the second direction DR2 and is disposed on the right side of the emission area EMA.

A part of the first electrode RME1 may be disposed on the first bank portion BN1, and a part of the second electrode RME2 may be disposed on the second bank portion BN2. The plurality of electrodes RME: RME1 and RME2 may be disposed at least on the inclined side surfaces of the bank portions BN1 and BN2, respectively. According to an embodiment of the present disclosure, the width of the plurality of electrodes RME measured in the second direction DR2 may be smaller than the width of the bank portions BN1 and BN2 measured in the second direction DR2. Each of the electrodes RME may be disposed to cover at least one side surface of the first bank BNL1 to reflect light emitted from the light-emitting diodes ED. The distance between the electrodes RME that are spaced from each other in the second direction DR2 may be smaller than the distance between the bank portions BN1 and BN2. At least a part of each of the electrodes RME may be disposed directly on the via layer VIA so that they may be disposed at the same plane.

In addition, the first electrode RME1 and the second electrode RME2 may be connected to the third conductive layer through a first electrode contact hole CTD and a second electrode contact hole CTS, respectively, which are formed at such locations that they overlap with the second bank BNL2 in the third direction DR3. The first electrode RME1 may be in contact with the second electrode pattern CDP2 through the first contact hole CTD penetrating through the via layer VIA thereunder. The second electrode RME2 may be in contact with the second voltage line VL2 through the second contact hole CTS penetrating through the via layer VIA thereunder. The first electrode RME1 may be electrically connected to the first transistor T1 through the second electrode pattern CDP2 and the first electrode pattern CDP1 to receive the first supply voltage. The second electrode RME2 may be electrically connected to the second voltage line VL2 to receive the second supply voltage. Although the first electrode contact hole CTD and the second electrode contact hole CTS are formed under the second bank BNL2 in FIG. 5, the present disclosure is not limited thereto. The electrode contact holes CTD and CTS may be disposed either in the emission area EMA or in the subsidiary area SA.

The electrodes RME disposed in different sub-pixels SPXn adjacent to each other in the first direction DR1 may be spaced from each other at the separation region ROP in the subsidiary area SA. Such arrangement of the electrodes RME may be formed by forming single electrode lines extending in the first direction DR1 and disposing the light-emitting diodes ED thereon, and then separating the electrode lines into parts during a subsequent process. The electrode lines may be used to generate an electric field in the sub-pixel SPXn to align the light-emitting diodes ED during the process of fabricating the display device 10.

After aligning the light-emitting diodes ED, the electrode lines are separated at the separation region ROP, such that the plurality of electrodes RME that are spaced from each other in the first direction DR1 may be formed. The process of separating the electrode lines may be carried out after the process of forming the second insulating layer PAS2 to be described later, and the second insulating layer PAS2 may not be disposed at the separation region ROP as shown in FIG. 6. The second insulating layer PAS2 may be utilized as a mask pattern in a process of separating the electrode lines.

The plurality of electrodes RME may be electrically connected to the light-emitting diodes ED. The electrodes RME may be connected to the light-emitting diodes ED through the connection electrodes CNE, namely, CNE1 and CNE2 to be described below, and may transmit electric signals applied from a conductive layer thereunder to the light-emitting diodes ED.

Each of the electrodes REM may include a conductive material having a high reflectance (e.g., reflectivity). For example, the electrodes RME may include a metal such as silver (Ag), copper (Cu) and aluminum (Al) as the material having a high reflectance, and may be an alloy including aluminum (Al), nickel (Ni), lanthanum (La), etc. The electrodes RME may reflect light that is emitted from the light-emitting diodes ED and travels toward the side surfaces of the first bank portions BNL1 toward the upper side of each of the sub-pixels SPXn.

However, it is to be understood that the present disclosure is not limited thereto. The electrodes RME may further include a transparent conductive material. For example, each of the electrodes RME may include a material such as ITO, IZO and ITZO. In some embodiments, each of the electrodes RME1 and RME2 may have a structure in which one or more layers of a transparent conductive material and one or more metal layers having high reflectivity are stacked on one another, or may be made up of a single layer including them. For example, each of the electrodes RME may have a stack structure such as ITO/Ag/ITO/, ITO/Ag/IZO, or ITO/Ag/ITZO/IZO.

The first passivation layer PAS1 is disposed on the via layer VIA, the first banks BNL1, and the plurality of electrodes RME. The first passivation layer PAS1 may be disposed on the via layer VIA to cover the plurality of electrodes RME and the first bank BNL1. In addition, the first passivation layer PAS1 may not be disposed at the separation region ROP in the subsidiary area where the electrodes RME adjacent to each other in the first direction DR1 are spaced from each other. The first passivation layer PAS1 can protect the plurality of electrodes RME and can insulate different electrodes RME from each other. In addition, the first insulating layer PAS1 can also prevent that the light-emitting diodes ED disposed thereon are brought into contact with other elements and damaged.

In an embodiment, the first insulating layer PAS1 may have steps so that a part of the upper surface of the first insulating layer PAS1 is recessed between the electrodes RME that are spaced from one another in the second direction DR2. The light-emitting diodes ED may be disposed at the steps of the upper surface of the first insulating layer PAS1, and a space may be formed between the light-emitting diodes ED and the first insulating layer PAS1 therebelow.

The first passivation layer PAS1 may include a plurality of contacts CT1 and CT2 exposing a part of the upper surface of each of the electrodes RME. The plurality of contacts CT1 and CT2 may penetrate through the first insulating layer PAS1, and the connection electrodes CNE described later may be in contact with the electrodes RME exposed through the contacts CT1 and CT2.

The second bank BNL2 may be disposed on the first passivation layer PAS1. The second bank BNL2 may be disposed in a lattice pattern including parts extended in the first direction DR1 and the second direction DR2 when viewed from the top, and may be disposed at the boundaries of the sub-pixels SPXn to distinguish the adjacent sub-pixels SPXn from each other. In addition, the second bank BNL2 may be disposed to surround the emission area EMA and the subsidiary area SA, and the areas defined and opened by the second bank BNL2 may be the emission area EMA and the subsidiary area SA, respectively.

The second bank BNL2 may have a predetermined height. In some embodiments, the upper surface of the second bank BNL2 may be higher than that of the first bank BNL1, and the thickness thereof may be equal to or greater than that of the first bank BNL1. The second bank BNL2 can prevent an ink from overflowing into adjacent sub-pixels SPXn during an inkjet printing process of the process of fabricating the display device 10. The second bank BNL2 can separate the different sub-pixels SPXn from one another so that the ink, in which different light-emitting diodes ED are dispersed, are not mixed. The second bank BNL2 may include, but is not limited to, polyimide, like the first bank BNL1.

The light-emitting diodes ED may be disposed on the first passivation layer PAS1 between the first electrode RME1 and the second electrode RME 2. The light-emitting diodes ED may include multiple layers disposed on the upper surface of the first substrate SUB in a direction parallel to the upper surface of the first substrate SUB. The light-emitting elements 30 of the display device 10 may be arranged such that they are extended in parallel to the first substrate SUB.

The multiple semiconductor layers included in the light-emitting elements 30 may be disposed sequentially in the direction parallel to the upper surface of the first substrate SUB. However, it is to be understood that the present disclosure is not limited thereto. In some embodiments, when the light-emitting diodes ED have a different structure, a plurality of layers may be disposed in a direction perpendicular to the first substrate SUB.

The light-emitting diodes ED may be disposed on the electrodes RME spaced from each other in the second direction DR2 between the different bank portions BN1 and BN2. The light-emitting diodes ED may be spaced from one another in the first direction DR1 in which the electrodes RME are extended, and may be aligned substantially parallel to one another. The light-emitting diodes ED may have a shape extended in a direction, and may have a length larger than the shortest distance between the electrodes RME that are spaced from one another in the second direction DR2. At least one end of each of the light-emitting diodes ED may be disposed on one of the different electrodes RME, or the both ends thereof may be disposed on the different electrodes RME. The direction in which the electrodes RME are extended may be substantially perpendicular to the direction in which the light-emitting diodes ED are extended. However, it is to be understood that the present disclosure is not limited thereto. The light-emitting diodes ED may be oriented obliquely to the direction in which the electrodes RME are extended.

The light-emitting diodes ED disposed in each of the sub-pixels SPXn may include a plurality of semiconductor layers, and may emit light of different wavelength bands depending on the material of the semiconductor layers. However, it is to be understood that the present disclosure is not limited thereto. The light-emitting diodes ED disposed in each of the sub-pixels SPXn may include the semiconductor layers made of the same material and may emit light of the same color. The light-emitting diodes ED may include semiconductor layers doped with impurities of different conductivity types and may be aligned so that their ends are directed in a particular orientation depending on the electric field generated over the electrodes RME. A first end and a second end, which are opposite each other, of each of the light-emitting diodes ED may be defined with respect to one of the semiconductor layers. For example, a part of the light-emitting diode ED disposed on the first electrode RME1 may be the first end while a part of the light-emitting diode ED disposed on the second electrode RME2 may be the second end. In an embodiment in which the display device 10 includes a larger number of electrodes RME, the light-emitting diodes ED disposed on different electrodes RME may have first ends directed in different orientations.

The light-emitting diodes ED may be in contact with the connection electrodes CNE: CNE1 and CNE2 so that they may be electrically connected thereto. As a portion of the semiconductor layer of each of the light-emitting diodes ED is exposed at the end surface on one side of the direction in which they are extended, the exposed portion of the semiconductor layer may be in contact with the connection electrodes CNE. Each of the light-emitting diodes ED may be electrically connected to the electrodes RME and the conductive layers under the via layer VIA through the connection electrodes CNE, and an electrical signal may be applied to it so that light of a particular wavelength range can be emitted.

The second insulating layer PAS2 may be disposed on the plurality of light-emitting diodes ED, the second bank BNL2 and the subsidiary area SA. The second insulating layer PAS2 may include a first pattern portion PT1 that is extended in the first direction DR1 and disposed on the plurality of light-emitting diodes ED. The first pattern portion PT1 may be disposed between the first bank portion BN1 and the second bank portion BN2 to partially surround the outer surfaces of the light-emitting diodes ED, leaving the both sides or both ends of the light-emitting diodes ED exposed. The first pattern portion PT1 may form a linear or island pattern in each sub-pixel SPXn when viewed from the top. The first pattern portion PT1 of the second insulating layer PAS2 can protect the light-emitting diodes ED and fix the light-emitting diodes ED during the process of fabricating the display device 10. In addition, the first pattern portion PT1 may be disposed to fill the space between light-emitting diodes ED and the first passivation layer PAS1 thereunder.

The first pattern portion PT1 of the second insulating layer PAS2 may be formed by patterning an organic insulating material entirely disposed on the sub-pixel SPXn to expose both ends of the light-emitting diodes ED. As the first pattern portion PT1 has a shape extended in the first direction DR1 while exposing the both ends of the light-emitting diodes ED, the length in the first direction DR1 may be larger than the width measured in the second direction DR2. In addition, as will be described later, the second insulating layer PAS2 includes an organic insulating material, and a thickness thereof (e.g., the thickness of the first pattern portion PT1) may be larger than a width measured in the second direction DR2. The first pattern portion PT1 having such a shape may be easily delaminated during a subsequent process. The second insulating layer PAS2 may have portions that have larger widths and connected to the first pattern portion PT1, to prevent the delamination of the first pattern portion PT1.

According to an embodiment of the disclosure, the second insulating layer PAS2 may include a first base portion BP1 disposed in the subsidiary area SA, and a second base portion BP2 disposed on the second bank BNL2. The first pattern portion PT1 disposed in the emission area EMA may be extended in the first direction DR1 to be connected to the first base portion BP1 or the second base portion BP2.

The first base portion BP1 may be disposed on the entire surface of the subsidiary area SA except for the separation region ROP and the locations where the connection electrodes CNE are disposed, which are to be described later. In the separation region ROP, after the second insulating layer PAS2 is formed, a process of separating the electrodes RME thereunder may be carried out. Accordingly, the first base portion BP1 may not be disposed in the separation region ROP. In addition, because the connection electrodes CNE are disposed in locations where the second insulating layer PAS2 is not disposed and are disposed over the side surfaces of the second insulating layer PAS2, the first base portion BP1 may not overlap the connection electrodes CNE in the thickness direction of the first substrate SUB.

The second base portion BP2 is disposed on the second bank portion BNL2. The second base portion BP2 may include a portion extended in the first direction DR1, a portion extended in the second direction DR2, and a portion protruding in the second direction DR2, similarly to the second bank BNL2. The second base portion BP2 may be extended in the first direction DR1 between the sub-pixels SPXn that are adjacent to each other in the second direction DR2 and may be extended in the second direction DR2 between the sub-pixels SPXn that are adjacent to each other in the first direction DR1. A part of the portion of the second base portion BP2 extended in the first direction DR1 may protrude in the third direction DR3 to be disposed on the second bank BNL2 between the emission area EMA and the subsidiary area SA of each sub-pixel SPXn. Because the connection electrodes CNE are disposed on the second bank portion BNL2 between the emission area EMA and the subsidiary area SA of each sub-pixel SPXn, a part of the portion of the second base portion BP2 that is extended in the first direction DR1 may be disposed on the second bank BNL2 so that it does not overlap with the connection electrodes CNE (e.g., see, FIG. 6). At the border of the subsidiary area SA surrounded by the second bank BNL, the first base portion BP1 and the second base portion BP2 may be in contact with each other.

Each of the first base portion BP1 and the second base portion BP2 may have the thickness equal to that of the first pattern portion PT1, and may have a larger width measured in the second direction DR2 than that of the first pattern portion. While the first pattern portion PT1 has a width smaller than the length of the light-emitting diodes ED, the widths of the first and second base portions BP1 and BP2 may be greater than that of the second bank BNL2 or may be equal to that of the area surrounded by the second bank portion BNL2. Compared to the first pattern portion PT1, the first base portion BP1 and the second base portion BP2 are not delaminated but can be firmly disposed on the first passivation layer PAS1 and the second bank portion BNL2.

As shown in FIG. 7, the first pattern portion PT1 may be extended in the first direction DR1 to be extended to the first base portion BP1 beyond the second bank BNL2. One side of the first pattern portion PT1 in the first direction DR1 may be connected to the second base portion BP2 disposed on the second bank portion BNL2, and the other side thereof in the first direction DR1 may be extended to the subsidiary area SA to be connected to the first base portion BP1. The one side of the first pattern portion PT1 may be connected to a portion of the second base portion BP2 that is disposed at the border of the sub-pixel SPXn and extended in the second direction DR2. The first base portion BP1 may include a connection pattern CNP that is disposed between the connection electrodes CNE and is connected to the first pattern portion PT1. The first pattern portion PT1 is connected to the first base portion BP1 and the second base portion BP2 and thus can be supported by the base portions BP1 and BP2 so that it is not delaminated during a subsequent process. In the display device 10, the second passivation PAS2 may have a structure that prevents the delamination of the first pattern portion PT1 fixing the light-emitting diodes ED. Accordingly, it is possible to prevent the issue that the light-emitting diodes ED and the first pattern portion PT1 are separated and remains as particles.

Although the first pattern portion PT1, the first base portion BP1, and the second base portion BP2 of the second insulating layer PAS2 are distinguished from one another in the drawings, these may be formed integrally. The portions of the second insulating layer PAS2 may be distinguished from one another by their locations and the connection relationship with other elements, but they may be formed via the same process to form a single second insulating layer PAS2.

The plurality of connection electrodes CNE: CNE1 and CNE2 may be disposed on the plurality of electrodes RME and the light-emitting diodes ED. In addition, the connection electrodes CNE may be disposed partially on the side surfaces of the first pattern portion PT1 of the second insulating layer PAS2, and may be spaced from the other connection electrodes CNE in the second direction DR2 with the first pattern portion PT1 therebetween. The parts of the connection electrodes CNE disposed on the side surface of the first pattern portion PT1 may be lower than the height of the first pattern portion PT1, and thus the connection electrodes CNE may not be disposed on the upper surface of the first pattern portion PT1 of the second insulating layer PAS2. The other portions of the second insulating layer PAS2, e.g., the first base portion BP1 and the second base portion BP2 may be in contact with the connection electrodes CNE such that their side surfaces are in contact with the connection electrodes CNE. In other words, according to an embodiment of the present disclosure, the plurality of connection electrodes CNE may not overlap with the second insulating layer PAS2 in the thickness direction. By performing a process of removing the material of the connection electrodes disposed on the second insulating layer PAS2, the first connection electrode CNE1 and the second connection electrode CNE2 that are spaced from each other may be formed. The connection electrodes CNE may not be disposed on the second insulating layer PAS2.

The plurality of connection electrodes CNE may be in contact with the light-emitting diodes ED and the electrodes RME. The connection electrodes CNE may be in direct contact with the semiconductor layer exposed at the both end surfaces of the light-emitting diodes ED, and may be in contact with at least one of the electrodes RME through contacts CT1 and CT2 penetrating through the first passivation layer PAS1. The both ends of the light-emitting diodes ED may be electrically connected to the electrodes RME through the plurality of connection electrodes CNE1 and CNE2.

The first connection electrode CNE1 may have a shape extended in the first direction DR1 and may be disposed on the first electrode RME1 in the third direction DR3. A part of the first connection electrode CNE1 disposed on the first bank portion BN1 may overlap the first electrode RME1 and may be extended in the first direction DR1 from it to the subsidiary area SA beyond the second bank BNL2. The first connection electrode CNE1 may include an expanded portion having a large width in the second direction DR2 in the subsidiary area SA, and the expanded portion may be in contact with the first electrode RME1 through the first contact CT1 exposing the upper surface of the first electrode RME1. The first connection electrode CNE1 may be in contact with the first ends of the light-emitting diodes ED and the first electrode RME1 to transmit an electric signal applied from the first transistor T1 (e.g., from the first voltage line VL1) to the light-emitting diodes ED.

The second connection electrode CNE2 may have a shape extended in the first direction DR1 and may be disposed on the second electrode RME2. A part of the second connection electrode CNE2 disposed on the second bank portion BN2 may overlap the second electrode RME2 and may be extended in the first direction DR1 from it to the subsidiary area SA beyond the second bank BNL2. The second connection electrode CNE2 may include an expanded portion having a large width in the second direction DR2 in the subsidiary area SA, and the expanded portion may be in contact with the second electrode RME2 through the second contact CT2 exposing the upper surface of the second electrode RME2. The second connection electrode CNE2 may be in contact with the second ends of the light-emitting diodes ED and the second electrode RME2 to transmit an electric signal applied from the second voltage line VL2 to the light-emitting diodes ED.

According to the described embodiment of the present disclosure, the plurality of contacts CT1 and CT2 may be spaced from the area where the plurality of light-emitting diodes ED is disposed in the first direction DR1 so that they do not overlap the light-emitting diodes ED in the second direction DR2. Although the contacts CT1 and CT2 are formed in the subsidiary area SA in FIG. 4 and FIG. 7, the present disclosure is not limited thereto. The contacts CT1 and CT2 may be formed in a part of the emission area EMA where the light-emitting diodes ED are not disposed.

The first connection electrode CNE1 and the second connection electrode CNE2 may be spaced from each other in the second direction DR2 when viewed from the top. The first connection electrode CNE1 and the second connection electrode CNE2 may be disposed so that they are not in contact with each other, and an electric signal applied to each of the connection electrodes CNE may flow through the light-emitting diodes ED. It is to be noted that the first connection electrode CNE1 and the second connection electrode CNE2 are disposed at substantially the same layer. However, it is to be understood that the present disclosure is not limited thereto. In some embodiments, the first connection electrode CNE1 and the second connection electrode CNE2 may be disposed on different layers, and another insulating layers may be further disposed between them.

The connection electrodes CNE may include a conductive material. For example, the connection electrodes CNE may include ITO, IZO, ITZO, aluminum (A1), etc. For example, the connection electrodes CNE may include a transparent conductive material, and light emitted from the light-emitting diodes ED may transmit the connection electrodes CNE to proceed toward the electrodes RME. However, it is to be understood that the present disclosure is not limited thereto.

In some embodiments, another insulating layer may be further disposed on the second insulating layer PAS2, and the plurality of connection electrodes CNE. The insulating layer may protect the elements disposed thereon against the external environment.

The above-described first passivation layer PAS1 may include an inorganic insulating material or an organic insulating material, and the second insulating layer PAS2 may include an organic insulating material. However, it is to be understood that the present disclosure is not limited thereto.

Figure 8:
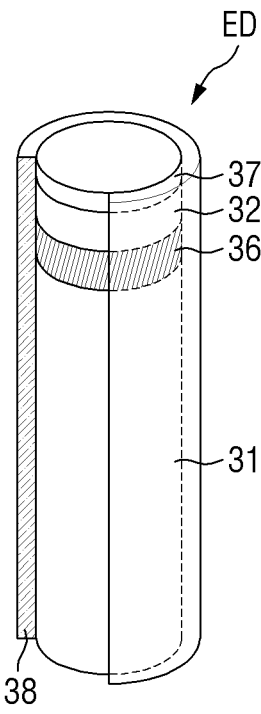
FIG. 8 is a cutaway perspective view showing a light-emitting element according to an embodiment of the disclosure.

FIG. 8 is a cutaway perspective view showing a light-emitting element according to an embodiment of the present disclosure.

Referring to FIG. 8, a light-emitting element ED may be a light-emitting diode. For example, the light-emitting element ED may have a size from nanometers to micrometers and may be an inorganic light-emitting diode made of an inorganic material. The light-emitting diode ED may be aligned between two electrodes (e.g., RME1 and RME2) that are facing each other as polarities are created by forming an electric field in a particular direction between the two electrodes.

The light-emitting diode ED according to an embodiment may have a shape extended in one direction. The light-emitting element ED may have a shape of a cylinder, a rod, a wire, a tube, etc. It is to be understood that the shape of the light-emitting diode ED is not limited thereto. The light-emitting diode ED may have a variety of shapes including a polygonal column shape such as a cube, a cuboid and a hexagonal column, or a shape that is extended in a direction with partially inclined outer surfaces.

The light-emitting diode ED may include semiconductor layers doped with impurities of a conductive type (e.g., p-type or n-type). The semiconductor layers may emit light of a certain wavelength band by transmitting an electric signal applied from an external power source. The light-emitting diode ED may include a first semiconductor layer 31, a second semiconductor layer 32, an emissive layer 36, an electrode layer 37, and an insulating film 38.

The first semiconductor layer 31 may be an n-type semiconductor. The first semiconductor layer 31 may include a semiconductor material having the following chemical formula: $Al_xGa_yIn_{1-x-y}N$ ($0 \leq x \leq 1$, $0 \leq y \leq 0 \leq x+y \leq 1$). For example, the first semiconductor layer 31 may be one or more of n-type doped AlGaInN, GaN, AlGaN, InGaN, AlN and InN. The n-type dopant doped into the first semiconductor layer 31 may be Si, Ge, Sn, etc.

The second semiconductor layer 32 is disposed above the first semiconductor layer 31 with the emissive layer 36 therebetween. The second semiconductor layer 32 may be a p-type semiconductor, and may include a semiconductor material having the following chemical formula: $Al_xGa_yIn_{1-x-y}N$ ($0 \leq x \leq 1$, $0 \leq y \leq 1$, $0 \leq x+y \leq 1$). For example, the second semiconductor layer 32 may be one or more of p-type doped AlGaInN, GaN, AlGaN, InGaN, AlN and InN. The p-type dopant doped into the second semiconductor layer 32 may be Mg, Zn, Ca, Se, Ba, etc.

Although each of the first semiconductor layer 31 and the second semiconductor layer 32 is implemented as a signal layer in FIG. 8, the present disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer.

The emissive layer 36 is disposed between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on one another. The emissive layer 36 may emit light as electron-hole pairs are combined therein in response to an electrical signal applied through the first semiconductor layer 31 and the second semiconductor layer 32. The emissive layer 36 may include a material such as AlGaN and AlGaInN. For example, when the emissive layer 36 has a multi-quantum well structure in which quantum layers and well layers are alternately stacked on one another, the quantum layers may include AlGaN or AlGaInN, and the well layers may include a material such as GaN and AlGaN.

The emissive layer 36 may have a structure in which a semiconductor material having a large band gap energy and a semiconductor material having a small band gap energy are alternately stacked on one another, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some embodiments.

The electrode layer 37 may be an ohmic connection electrode. However, it is to be understood that the present disclosure is not limited thereto. The electrode layer 37 may be a Schottky connection electrode. The light-emitting diode ED may include at least one electrode layer 37. The light-emitting diode ED may include one or more electrode layers 37. However, it is to be understood that the present disclosure is not limited thereto. The electrode layer 37 may be eliminated.

The electrode layer 37 can reduce the resistance between the light-emitting element ED and the electrodes or the connection electrodes when the light-emitting element ED is electrically connected to the electrodes or the connection electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO and ITZO.

The insulating film 38 is disposed to surround the outer surfaces (e.g., the outer peripheral or circumferential surfaces) of the plurality of semiconductor layers and electrode layers described above. For example, the insulating film 38 may be disposed to surround at least the outer surface (e.g., the outer peripheral or circumferential surfaces) of the emissive layer 36, with both ends of the light-emitting element ED in the longitudinal direction exposed. In addition, a part of the upper surface of the insulating film 38 may be rounded in cross section, which is adjacent to at least one of the ends of the light-emitting diode ED.

The insulating film 38 may include materials having insulating properties such as silicon oxide (SiOx), silicon nitride (SiNx), silicon oxynitride (SiOxNy), aluminum nitride (AlNx) and aluminum oxide (AlOx). Although the insulating film 38 is formed as a single layer in FIG. 8, the present disclosure is not limited thereto. In some embodiments, the insulating film 38 may be made up of a multilayer structure in which multiple layers are stacked on one another.

The insulating film 38 may serve to protect the above-described elements. The insulating film 30 can prevent an electrical short-circuit that may occur in the emissive layer 36 if it comes in direct contact with an electrode through which an electrical signal is transmitted to the light-emitting diode ED. In addition, the insulating film 38 can prevent a decrease in luminous efficiency.

In addition, the outer surface (e.g., the outer peripheral or circumferential surface) of the insulating film 38 may be subjected to surface treatment. The light-emitting diodes ED may be dispersed in an ink, and the ink may be sprayed onto the electrodes (e.g., RME). In doing so, a surface treatment may be applied to the insulating film 38 so that it becomes hydrophobic or hydrophilic in order to keep the light-emitting diodes ED dispersed in the ink from being aggregated with one another.

In the display device 10 according to an embodiment, the second insulating layer PAS2 may have a structure that prevents the delamination of the first pattern portion PT1 disposed on the light-emitting diodes ED. The structure and shape of the second insulating layer PAS2 may be modified in a variety of ways according to the number of electrodes RME disposed in each of the sub-pixels SPXn. Hereinafter, display devices according to a variety of embodiments of the present disclosure will be described with reference to other drawings.

Figure 9:
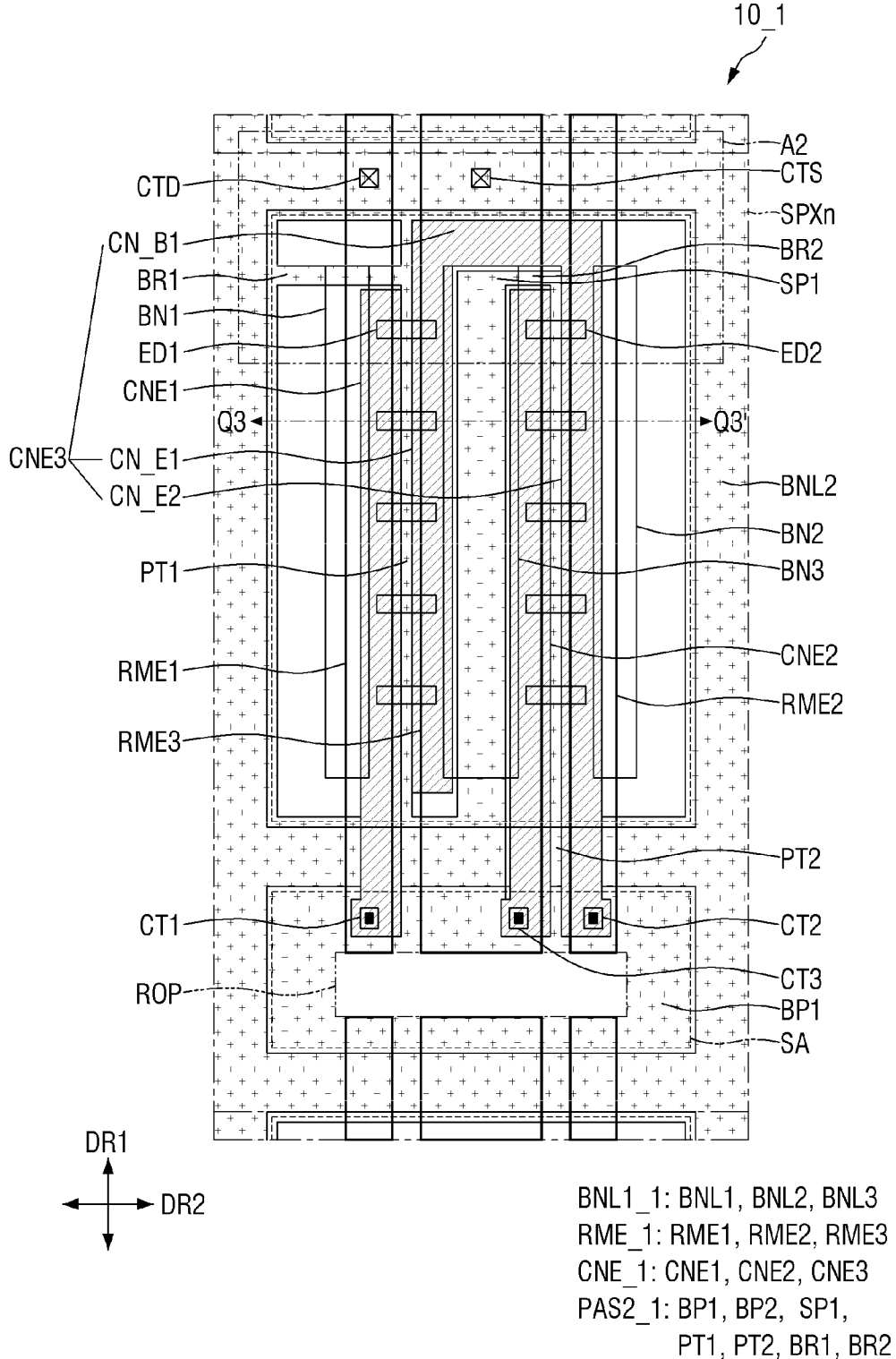
FIG. 9 is a plan view showing a sub-pixel of a display device according to an embodiment of the disclosure.
Figure 10:
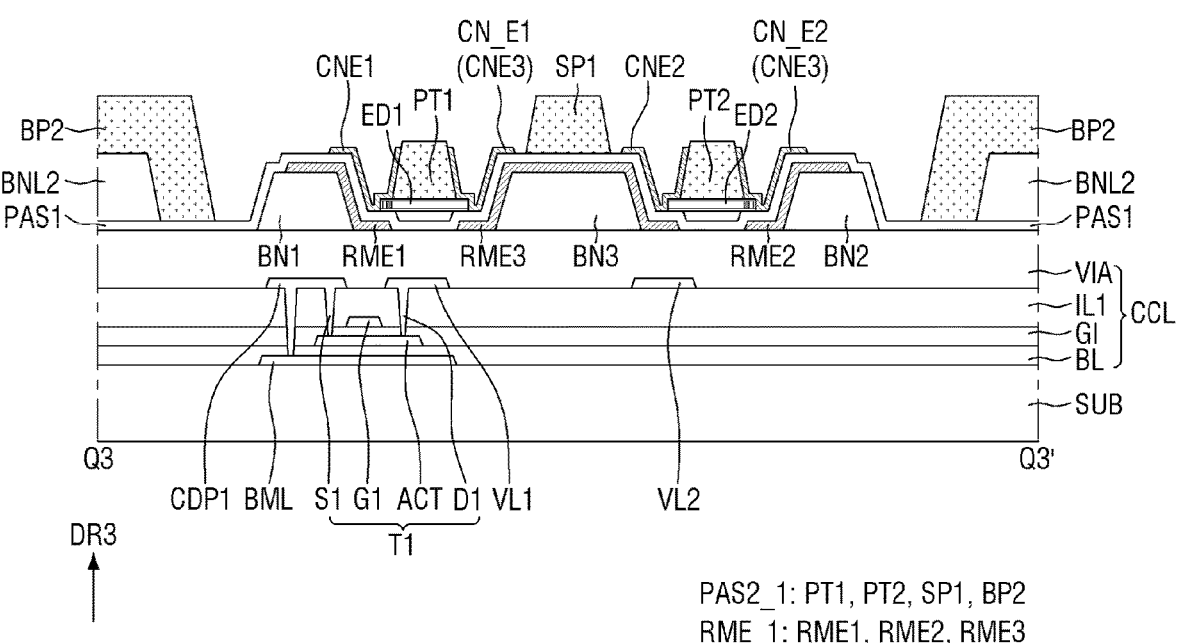
FIG. 10 is a cross-sectional view taken along the line Q3-Q3' of FIG. 9.
Figure 11:
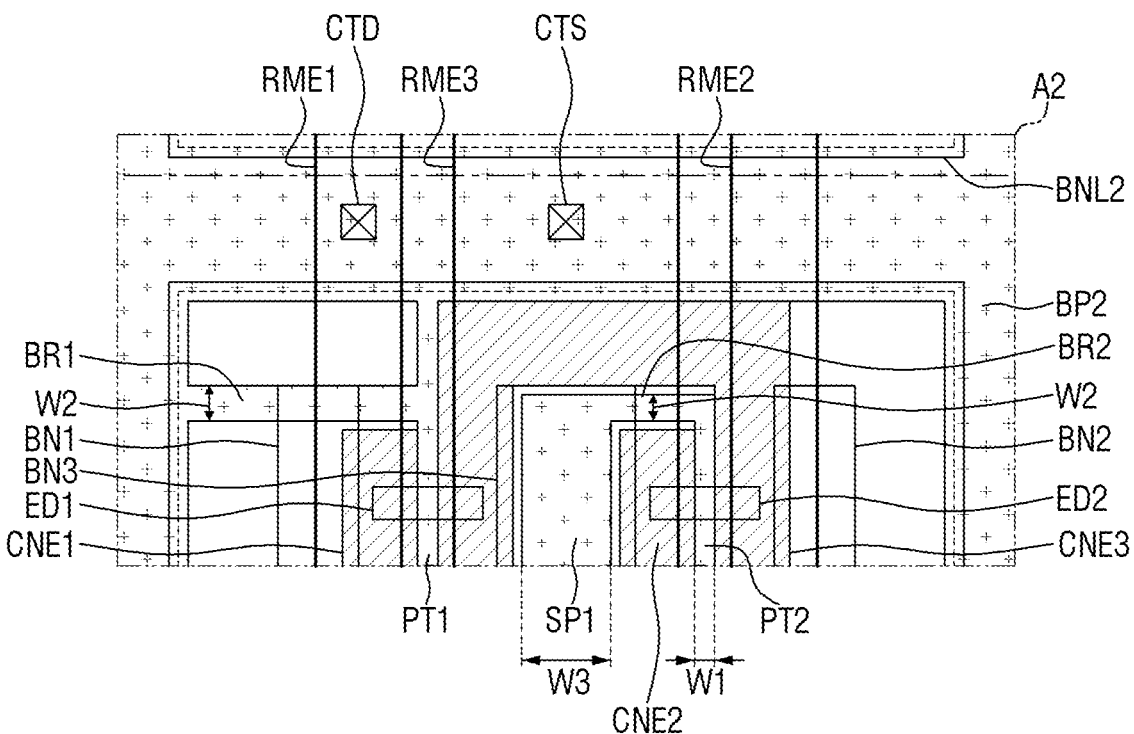
FIG. 11 is an enlarged view of a portion A2 of FIG. 9.

FIG. 9 is a plan view showing a sub-pixel of a display device according to an embodiment of the present disclosure. FIG. 10 is a cross-sectional view taken along the line Q3-Q3' of FIG. 9. FIG. 11 is an enlarged view of a portion A2 of FIG. 9.

Referring to FIGS. 9-11, a display device 10_1 according to an embodiment may include a greater number of electrodes RME_1 for each of the sub-pixels SPXn, and the number of light-emitting diodes ED disposed in each of the sub-pixels SPXn may increase. Accordingly, a second insulating layer PAS2_1 may further include, in addition to the plurality of pattern portions PT1 and PT2, other pattern portions SP1 connected to each of the pattern portions PT1 and PT2 to prevent the delamination of the pattern portions PT1 and PT2.

A first bank BNL1 may further include a third bank portion BN3 having a width different from the widths of the first bank portion BN1 and the second bank portion BN2, in addition to the first bank portion BN1 and the second bank portion BN2. The third bank portion BN3 may be disposed between the first bank portion BN1 and the second bank portion BN2 and may have a shape extending in the first direction DR1. The first bank portion BN1, the second bank portion BN2 and the third bank portion BN3 may have the same length extending in the first direction DR1, but the third bank portion BN3 may have a larger width measured in the second direction DR2 than the widths of the other bank portions (e.g., BN1 and BN2).

The third bank portion BN3 may be spaced from the first bank portion BN1 and the second bank portion BN2 in the second direction DR2. The third bank portion BN3 may have a larger width than the first bank portion BN1 so that a third electrode RME3 to be described later may be disposed. The light-emitting diodes ED may be disposed between the first bank portion BN1 and the third bank portion BN3, and between the second bank portion BN2 and the third bank portion BN3.

The first electrode RME1 may be disposed on the first bank portion BN1, and the second electrode RME2 may be disposed on the second bank portion BN2. Detailed descriptions thereon have been given above with reference to FIGS. 2 and 3.

The third electrode RME3 is disposed on the third bank portion BN3. The third electrode RME3 may be extended in the first direction DR1 between the first electrode RME1 and the second electrode RME2 and may be disposed across the emission area EMA and the subsidiary area SA. In some embodiments, the width of the third electrode RME3 may be greater than the width of the first electrode RME1 and the second electrode RME2 and greater than the width of the third bank portion BN3. The third electrode RME3 may be disposed to cover both side surfaces of the third bank portion BN3, and may be spaced from and face the first electrode RME1 and the second electrode RME2 in the second direction DR2.

Similar to the first electrode RME1, the third electrode RME3 may be connected to the third conductive layer under the via layer VIA. The third electrode RME3 may be connected to the second voltage line VL2 through the second electrode contact hole CTS formed at such a location that it overlaps with the second bank BNL2 in the thickness direction of the first substrate SUB. However, unlike the first electrode RME1 and the third electrode RME3, the second electrode RME2 may not be connected to the third conductive layer. The second electrode RME2 may be connected to the second connection electrode CNE2, and an electric signal flowing along the light-emitting diodes ED may be applied thereto. As will be described later, the second electrode RME2 may provide an electrical connection path for different light-emitting diodes ED together with the second connection electrode CNE2.

The light-emitting diodes ED may be disposed between the first bank portion BN1 and the third bank portion BN3, and between the third bank portion BN3 and the second bank portion BN2. The first light-emitting diodes ED1 disposed between the first bank portion BN1 and the third bank portion BN3 may have first ends disposed on the first electrode RME1 and second ends disposed on one side of the third electrode RME3. The second light-emitting diodes ED2 disposed between the third bank portion BN3 and the second bank portion BN2 may have first ends disposed on the second electrode RME2 and second ends disposed on the opposite side of the third electrode RME3. According to an embodiment of the present disclosure, the first ends of the first light-emitting diodes ED1 may be opposite (or facing away from) the first ends of the second light-emitting diode ED2.

The second insulating layer PAS2_1 may include a first pattern portion PT1 and a second pattern portion PT2 disposed on the light-emitting diodes ED between the bank portions BN1, BN2, and BN3 of the first bank BNL1. Each of the first pattern portion PT1 and the second pattern portion PT2 may be extended in the first direction DR1 and may cover the first light-emitting diodes ED1 and the second light-emitting diodes ED2. These may be around (e.g., may surround) and fix the plurality of light-emitting diodes ED.

As described above with reference to FIGS. 2-7, each of the first pattern portion PT1 and the second pattern portion PT2 may have a width smaller than its length and thickness, and the second insulating layer PAS2_1 may have a structure that can prevent the delamination of them. According to an embodiment of the present disclosure, the second insulating layer PAS2_1 may further include a first support pattern portion SP1 connected to at least some of the plurality of pattern portions PT1 and PT2, and a plurality of bridge portions BR1 and BR2 connecting the pattern portions PT1 and PT2 with the first support pattern portion SP1 or the second base portion BP2.

The first pattern portion PT1 may be extended in the first direction DR1 so that one side thereof in the first direction DR1 may be connected to a portion of the second base portion BP2 extended in the second direction DR2 while the other side thereof in the first direction DR1 may be connected to the first base portion BP1. In addition, the first pattern portion PT1 may be connected to the second base portion BP2 through the first bridge portion BR1. The first bridge portion BR1 may have a shape extended in the second direction DR2, and may be connected to a part of the second base portion BP2 extended in the first direction DR1 and the first pattern portion PT1. The first bridge portion BR1 may be disposed to be spaced from one end of the first connection electrode CNE1 in the first direction DR1 that is disposed in the emission area EMA. Alternatively, the first bridge portion BR1 may be disposed in contact with the one end of the first connection electrode CNE1 depending on process conditions when the first connection electrode CNE1 is formed. The first pattern portion PT1 can be supported by the first bridge portion BR1 extended in the second direction DR2 in addition to the base portions BP1 and BP2 located on both sides in the first direction DR1 so that it is not delaminated during a subsequent process.

The second pattern portion PT2 may also be extended in the first direction DR1 so that the opposite side in the first direction DR1 may be connected to the first base portion BP1. However, because the first bridge portion CN_B1 of the third connection electrode CNE3 is disposed on one side in the first direction DR1, it may not be directly connected to the second base portion BP2. The second pattern portion PT2 may be connected to the first support pattern portion SP1 disposed between the second pattern portion PT2 and the first pattern portion PT1 to have a structure that prevents the delamination.

The first support pattern portion SP1 may be extended in the first direction DR1 on the third bank portion BN3 and the third electrode RME3. The first support pattern portion SP1 may be disposed between the first extended portion CN_E1 of the third connection electrode CNE3 and the second connection electrode CNE2, which may be spaced from the side surfaces of the first support pattern portion SP1, respectively. Similar to the first bridge portion BR1, the first support pattern portion SP1 may have the both side surfaces in contact with the first extended portion CN_E1 and the second connection electrode CNE2 depending on the process conditions of forming the connection electrodes CNE_1. One side of the first pattern portion PT1 in the first direction DR1 may be spaced from the first bridge portion CN_B1, and the other side thereof in the first direction DR1 may be extended to the subsidiary area SA to be connected to the first base portion BP1. A connection pattern disposed on the second bank BNL2 may be located on the opposite side of the first pattern portion PT1 and the first support pattern portion SP1 in the first direction DR1, and they may be connected to the first base portion BP1 through it.

The second bridge portion BR2 may have a shape extending in the second direction DR2 and may be connected to the first support pattern portion SP1 and the second pattern portion PT2. The second bridge portion BR2 may be disposed to be spaced from one end of the second connection electrode CNE2 in the first direction DR1 that is disposed in the emission area EMA and the first bridge portion CN_B1 of the third connection electrode CNE3. Alternatively, the second bridge portion BR2 may be in contact with the second connection electrode CNE2 and the first bridge portion CN_B1 of the third connection electrode CNE3. The second pattern portion PT2 may be supported by the second bridge portion BR2 extended in the second direction DR2 and the first support pattern portion SP1 in addition to the first base portion BP1 located on the opposite side in the first direction DR1 so that it is not delaminated during a subsequent process.

Unlike the base portions BP1 and BP2, the first support pattern portion SP1 and the plurality of bridge portions BR1 and BR2 are disposed in the emission area EMA. In order to prevent the delamination of the pattern portions PT1 and PT2, the first support pattern portion SP1 and the plurality of bridge portions BR1 and BR2 may have a larger width than the pattern portions PT1 and PT2 even in a narrow space within the emission area EMA. As shown in FIG. 11, according to an embodiment of the present disclosure, the width W3 of the first support pattern portion SP1 measured in the second direction DR2 and the width W2 of the bridge portions BR1 and BR2 measured in the first direction DR1 may be greater than the width W1 of the pattern portions PT1 and PT2. The first width W1 of the pattern portions PT1 and PT2 may be smaller than the length of the light-emitting diodes ED. On the other hand, the second width W2 of the bridge portions BR1 and BR2 may be greater than the first width W1 of the pattern portions PT1 and PT2 and the length of the light-emitting diodes ED. In addition, because the length of the bridge portions BR1 and BR2 in the second direction DR2 is shorter than the length of the pattern portions PT1 and PT2 in the first direction DR1, the difference between the width of the bridge portions BR1 and BR2 and the length thereof in the second direction DR2 may be smaller than the pattern portions PT1 and PT2. Accordingly, the bridge portions BR1 and BR2 are more robust than the pattern portions PT1 and PT2 so that it is not delaminated during a subsequent process and can fix the pattern portions PT1 and PT2 as well.

Because the first support pattern portion SP1 is extended in the first direction DR1 similar to the pattern portions PT1 and PT2, it may have a larger width W3 in order to prevent the delamination of the pattern portions PT1 and PT2. According to an embodiment of the present disclosure, the third width W3 of the first support pattern portion SP1 may be greater than the second width W2 of the bridge portions BR1 and BR2. The display device 10_1 according to an embodiment may include a greater number of electrodes RME_1 and connection electrodes CNE_1. Accordingly, the second insulating layer PAS2_1 may include a greater number of pattern portions PT1 and PT2, and may include the first support pattern portion SP1 and a plurality of bridge portions BR1 and BR2, thereby may prevent the delamination of the pattern portions PT1 and PT2.

The plurality of connection electrodes CNE_1 may include a first connection electrode CNE1 disposed on the first electrode RME1, a second connection electrode CNE2 disposed on the opposite side of the third electrode RME3, and a third connection electrode CNE3 disposed on the one side of the third electrode RME3 and the second electrode RME2.

The first connection electrode CNE1 may be in contact with the first electrode RME1 and first ends of the first light-emitting diodes ED1. The first connection electrode CNE1 may be in contact with the first electrode RME1 through the first contact CT1 penetrating the first passivation layer PAS1. The second connection electrode CNE2 may be in contact with the third electrode RME3 and second ends of the second light-emitting diodes ED2. The second connection electrode CNE2 may be in contact with the third electrode RME3 through the third contact CT3 penetrating the first passivation layer PAS1. The first connection electrode CNE1 and the second connection electrode CNE2 may have a shape extended in the first direction DR1 and may be disposed to extend from the emission area EMA to the subsidiary area SA.

The third connection electrode CNE3 may include a first extended portion CN_E1 disposed on one side of the third electrode RME3 and extended in the first direction DR1, a second extended portion CN_E2 disposed on the second electrode RME2 and extended in the first direction DR1, and a first bridge portion CN_B1 connecting between the first extended portion CN_E1 and the second extended portion CN_E2. The first extended portion CN_E1 and the second extended portion CN_E2 of the third connection electrode CNE3 may be spaced from each other in the second direction DR2 with the second connection electrode CNE2 therebetween. The first extended portion CN_E1 may be spaced from and face the first connection electrode CNE1, and the second extended portion CN_E2 may be spaced from and face the second connection electrode CNE2. The first extended portion CN_E1 may be in contact with the second ends of the first light-emitting diodes ED1, and the second extended portion CN_E2 may be in contact with the first ends of the second light-emitting diodes ED2.

The first bridge portion CN_B1 may have a shape extended in the second direction DR2 in the emission area EMA, and may connect between the first extended portion CN_E1 and the second extended portion CN_E2. The first bridge portion CN_B1 may be disposed between the first support pattern portion SP1 and the second base portion BP2 of the second insulating layer PAS2_1, and may be spaced from side surfaces thereof. The first extended portion CN_E1 of the third connection electrode CNE3 may be extended to the subsidiary area SA, and may be connected to the third electrode RME3 through the third contact CT3 penetrating the first passivation layer PAS1 (see, for example, FIG. 12).

The first ends of the first light-emitting diodes ED1 may be electrically connected to the first electrode RME1 through the first connection electrode CNE1, and the second ends of the second light-emitting diodes ED2 may be electrically connected to the third electrode RME3 through the second connection electrode CNE2. The second ends of the first light-emitting diodes ED1 and the first ends of the second light-emitting diodes ED2 may be connected in series through the third connection electrode CNE3. In addition to the parallel connection of the plurality of light-emitting diodes ED, the light-emitting diodes ED: ED1 and ED2 located on the opposite sides of the third bank portion BN3, may be connected in series. Unlike the embodiment of FIG. 2, the display device 10_1 according to the embodiment of FIG. 9 includes a greater number of light-emitting diodes ED for each of the sub-pixels SPXn to implement the serial connection, thereby increasing the amount of emitted light per unit area.

Figure 12:
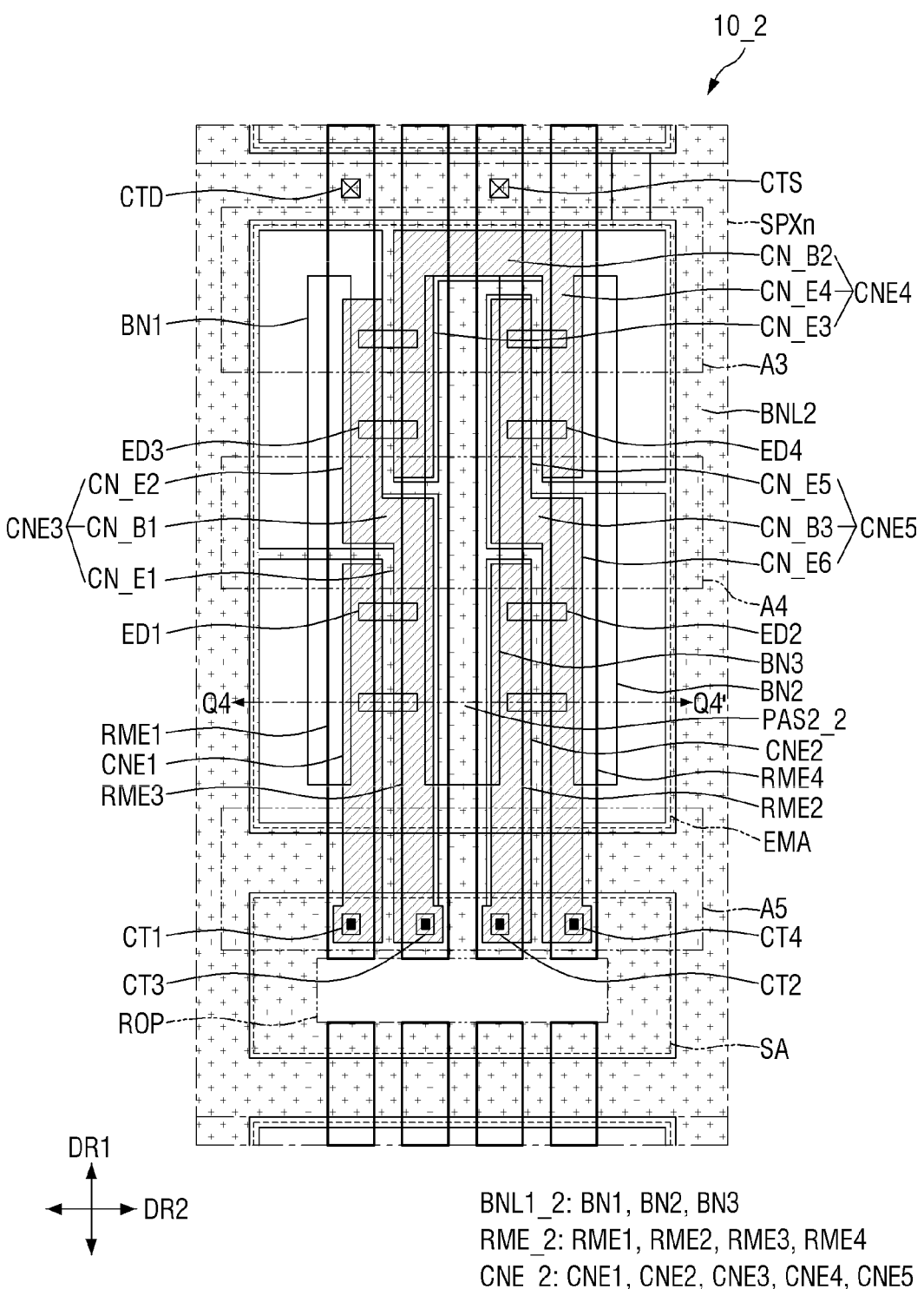
FIG. 12 is a plan view showing a sub-pixel of a display device according to an embodiment of the disclosure.
Figure 13:
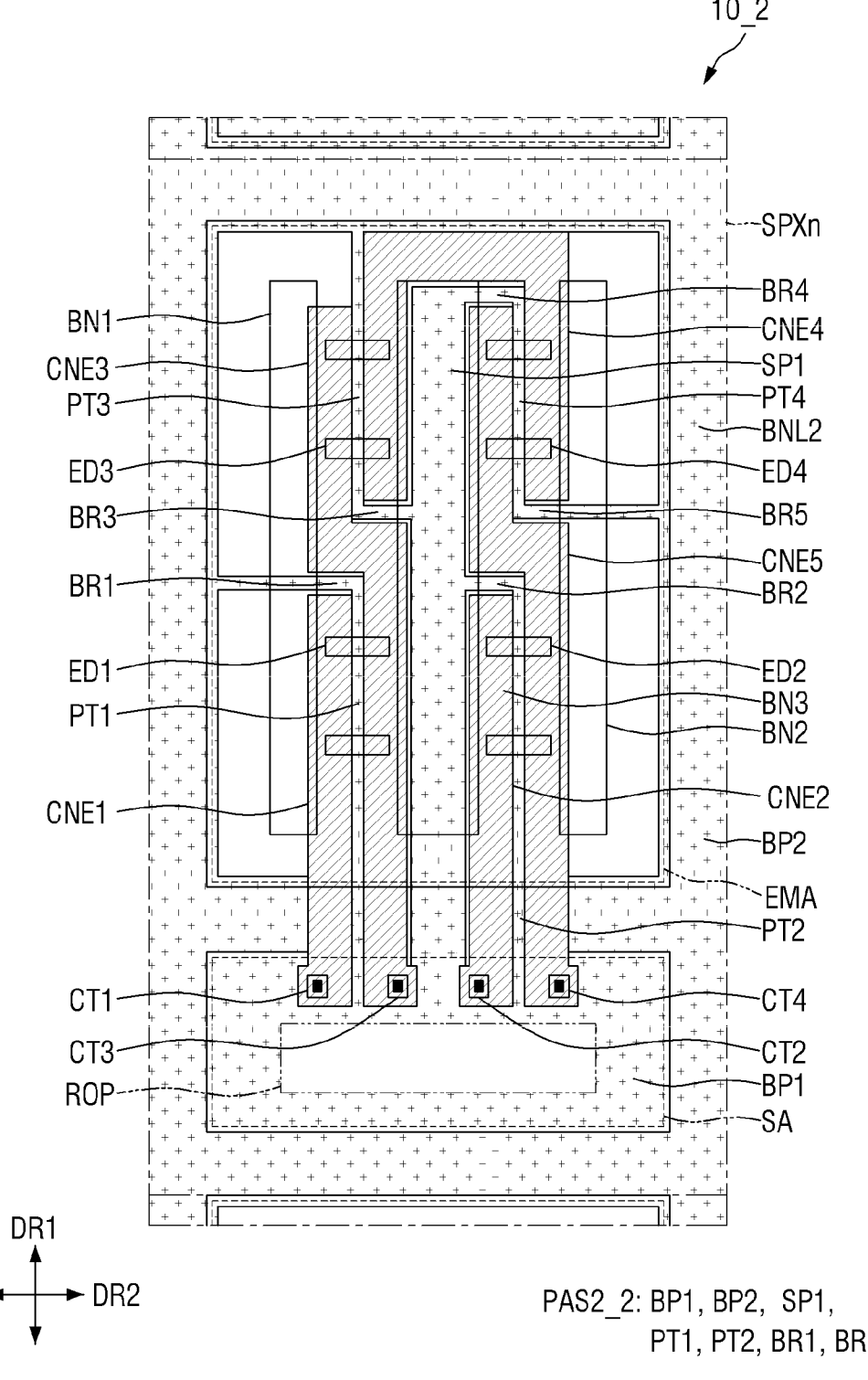
FIG. 13 is a plan view showing relative arrangements of a first bank portion, a second bank portion, a plurality of connection electrodes, and a second insulating layer disposed in a sub-pixel of FIG. 12.
Figure 14:
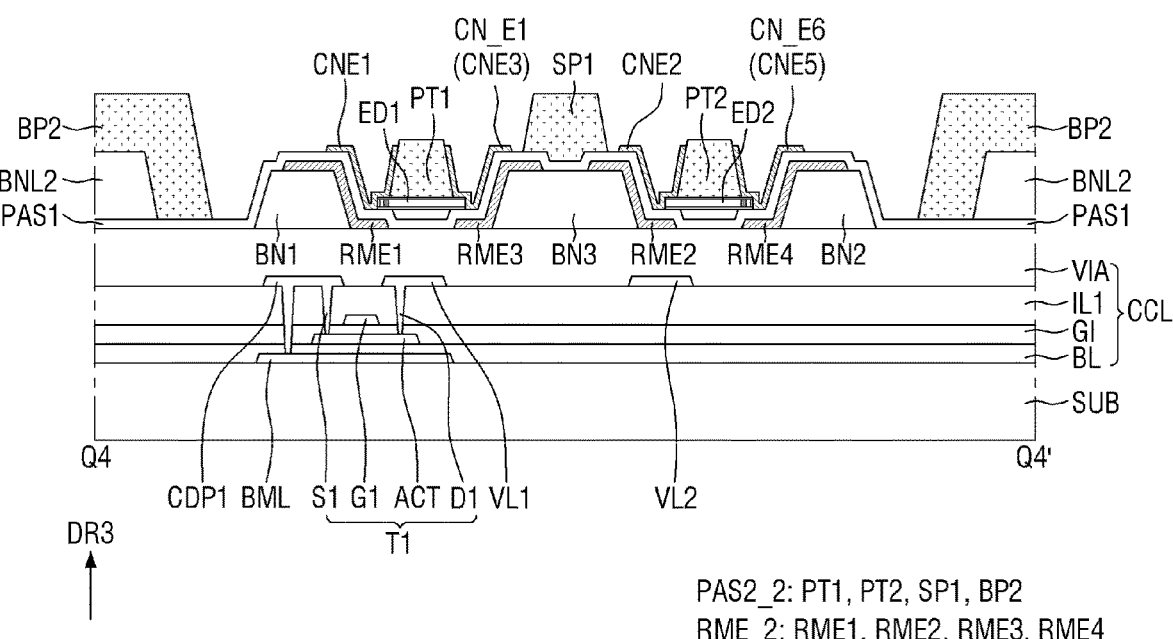
FIG. 14 is a cross-sectional view taken along the line Q4-Q4' of FIG. 12.

FIG. 12 is a plan view showing a sub-pixel of a display device according to an embodiment of the present disclosure. FIG. 13 is a plan view showing relative arrangements of a first bank portion, a second bank portion, a plurality of connection electrodes, and a second insulating layer disposed in a sub-pixel of FIG. 12. FIG. 14 is a cross-sectional view taken along the line Q4-Q4' of FIG. 12.

Referring to FIGS. 12-14, a display device 10_2 according to an embodiment may include a greater number of electrodes RME_2 for each of the sub-pixels SPXn. In addition, the second insulating layer PAS2_2 may further include a greater number of pattern portions PT1, PT2, PT3 and PT4 and bridge portions BR1, BR2, BR3, BR4 and BR5. In the display device 10_2, four electrodes RME_2: RME1, RME2, RME3 and RME4 may be disposed for each of the sub-pixels SPXn, and five connection electrodes CNE_2: CNE1, CNE2, CNE3, CNE4 and CNE5 for serial connection configuration of the light-emitting diodes ED: ED1, ED2, ED3, and ED4 disposed therebetween may be disposed. The plurality of light-emitting diodes ED may be connected in series with each other according to the connection electrodes CNE_2 connected to the both ends. The second insulating layer PAS2_2 may include a plurality of pattern portions PT1, PT2, PT3, and PT4 for fixing the light-emitting diodes ED, and may have a structure preventing the delamination of them. In the following description, descriptions will focus on the difference, and the redundant descriptions will be omitted.

The first electrode RME1, the third electrode RME3, the second electrode RME2, and the fourth electrode RME4 are arranged in this order along the second direction DR2. The electrodes RME_2 may be extended in the first direction DR1 and may be arranged across the emission area EMA and the subsidiary area SA.

The first electrode RME1 is disposed on the first bank portion BN1, and the third electrode RME3 is disposed on one side of the third bank portion BN3. The second electrode RME2 may be disposed on the opposite side of the third bank portion BN3, and the fourth electrode RME4 may be disposed on the second bank portion BN2. The electrodes RME_2 may be spaced from each other in the second direction DR2, and the first electrode RME1 and the third electrode RME3 may face each other, and the second electrode RME2 and the fourth electrode RME4 may face each other.

The first electrode RME1 and the second electrode RME2 may be connected directly to the third conductive layer through a first electrode contact hole CTD and a second electrode contact hole CTS penetrating through the via layer VIA, respectively, which are formed at such locations that they overlap with the second bank BNL in the third direction DR3. On the other hand, the third electrode RME3 and the fourth electrode RME4 may not be directly connected to the third conductive layer. The third electrode RME3 and the fourth electrode RME4 may be connected to the third and fifth connection electrodes CNE3 and CNE5, respectively, and electric signals flowing along the light-emitting diodes ED may be applied thereto. As will be described later, the third electrode RME3 and the fourth electrode RME4 together with the third connection electrode CNE3 and the fifth connection electrode CNE5 may provide electrical connection paths for different light-emitting diodes ED.

Among the light-emitting diodes ED, the first light-emitting diodes ED1 and the third light-emitting diodes ED3 may be disposed between the first bank portion BN1 and the third bank portion BN3, and the second light-emitting diodes ED2 and the fourth light-emitting diodes ED4 may be disposed between the third bank portion BN3 and the second bank portion BN2. The first light-emitting diodes ED1 and second light-emitting diodes ED2 may be disposed in the emission area EMA of each sub-pixel SPXn adjacent to the subsidiary area SA of the sub-pixel SPXn, while the third light-emitting diodes ED3 and fourth light-emitting diodes ED4 may be disposed in the emission area EMA of the sub-pixel SPXn adjacent to the subsidiary area SA of another sub-pixel SPXn. In other words, the first light-emitting diodes ED1 and the second light-emitting diodes ED2 may be disposed on one side of the emission area EMA in the first direction DR1, i.e., on the lower side, and the third light-emitting diodes ED3 and the fourth light-emitting diodes ED4 may be disposed on the opposite side of the emission area EMA in the first direction DR1, i.e., on the upper side.

It is to be noted that the light-emitting diodes ED may not be sorted by their positions in the emission area EMA but may be sorted by connection relationships with the connection electrodes CNE_2 to be described later. The both ends of the light-emitting diodes ED may be in contact with different connection electrodes CNE_2 depending on the arrangement structure of the connection electrodes CNE_2, and may be sorted into different light-emitting diodes ED depending on the types of the connection electrodes CNE_2 that the light-emitting diodes ED are in contact with.

The first ends of the first light-emitting diodes ED1 and the third light-emitting diodes ED3 may be disposed on the first electrode RME1, and the second ends thereof may be disposed on the third electrode RME3. The first ends of the second light-emitting diodes ED2 and the fourth light-emitting diodes ED4 may be disposed on the fourth electrode RME4, and the second ends thereof may be disposed on the second electrode RME2. The first ends of the first light-emitting diodes ED1 and the third light-emitting diodes ED3 may face away from the first ends of the second light-emitting diodes ED2 and fourth light-emitting diodes ED4.

The plurality of connection electrodes CNE_2 may further include the third connection electrode CNE3, the fourth connection electrode CNE4, and the fifth connection electrode CNE5 disposed across the plurality of electrodes RME_2, in addition to the first connection electrode CNE1 disposed on the first electrode RME1 and the second connection electrode CNE2 disposed on the second electrode RME2.

Unlike the embodiments of FIGS. 2 and 9, each of the first and second connection electrodes CNE1 and CNE2 may have relatively short lengths and may be extended in the first direction DR1. The first connection electrode CNE1 and the second connection electrode CNE2 may be disposed on the lower side of the center of the emission area EMA. The first connection electrode CNE1 and the second connection electrode CNE2 may be disposed across the emission area EMA and the subsidiary area SA of the respective sub-pixel SPXn, and may be in contact with the first electrode RME1 and the second electrode RME2 through the first contact CT1 and the second contact CT2 formed in the subsidiary area SA, respectively.

The third connection electrode CNE3 may include a first extended portion CN_E1 disposed on the third electrode RME3, a second extended portion CN_E2 disposed on the first electrode RME1, and the first bridge portion CN_B1 connecting between the first extended portion CN_E1 and the second extended portion CN_E2. The first extended portion CN_E1 may be spaced from and face the first connection electrode CNE1 in the second direction DR2, and the second extended portion CN_E2 may be spaced from the first connection electrode CNE1 in the first direction DR1. The first extended portion CN_E1 may be disposed on the lower side in the emission area EMA of the respective sub-pixel SPXn, and the second extended portion CN_E2 may be disposed on the upper side in the emission area EMA. The first extended portion CN_E1 may be disposed across the emission area EMA and the subsidiary area SA to be connected to the third electrode RME3 through a third contact part CT3 formed in the subsidiary area SA. The first bridge portion CN_B1 may be disposed across the first electrode RME1 and the third electrode RME3 in the middle of the emission area EMA. The third connection electrode CNE3 may be generally extended in the first direction DR1 and may have a shape that is bent in the second direction DR2 (e.g., the first bridge portion CN_B1) and extended in the first direction DR1 again.

The fourth connection electrode CNE4 may include a third extended portion CN_E3 disposed on the third electrode RME3, a fourth extended portion CN_E4 disposed on the fourth electrode RME4, and a second bridge portion CN_B2 connecting between the third extended portion CN_E3 and the fourth extended portion CN_E4. The third extended portion CN_E3 may be spaced from and face the second extended portion CN_E2 of the third connection electrode CNE3 in the second direction DR2, and the fourth extended portion CN_E4 may be spaced from and face a fifth extended portion CN_E5 of the fifth connection electrode CNE5 to be described in the first direction DR1. The third extended portion CN_E3 and the fourth extended portion CN_E4 may be disposed on the upper side in the emission area EMA, and the second bridge portion CN_B2 may be disposed across the third electrode RME3, the second electrode RME2, and the fourth electrode RME4. The fourth connection electrode CNE4 may be disposed in a shape that is around (e.g., surrounds) the fifth extended portion CN_E5 of the fifth connection electrode CNE5.

The fifth connection electrode CNE5 may include a fifth extended portion CN_E5 disposed on the second electrode RME2, a sixth extended portion CN_E6 disposed on the fourth electrode RME4, and a third bridge portion CN_B3 connecting between the fifth extended portion CN_E5 and the sixth extended portion CN_E6. The fifth extended portion CN_E5 may be spaced from and face the fourth extended portion CN_E4 of the fourth connection electrode CNE4 in the second direction DR2, and the sixth extended portion CN_E6 may be spaced from the second connection electrode CNE2 in the second direction DR2. The fifth extended portion CN_E5 may be disposed on the upper side in the emission area EMA of the respective sub-pixel SPXn, and the sixth extended portion CN_E6 may be disposed on the lower side in the emission area EMA. The sixth extended portion CN_E6 may be disposed across the emission area EMA and the subsidiary area SA to be connected to the fourth electrode RME4 through a fourth contact CT4 formed in the subsidiary area SA. The third bridge portion CN_B3 may be disposed across the second electrode RME2 and the fourth electrode RME4 adjacent to the center of the emission area EMA. The fifth connection electrode CNE5 may be generally extended in the first direction DR1 and may have a shape that is bent in the second direction DR2 (e.g., the third bridge portion CN_B3) and extended in the first direction DR1 again.

The first connection electrode CNE1 and the second connection electrode CNE2 may be first-type connection electrodes in contact with the first electrode RME1 and the second electrode RME2, respectively, that are directly connected to the third conductive layer. The third connection electrode CNE3 and the fifth connection electrode CNE5 may be second-type connection electrodes in contact with the third electrode RME3 and the fourth electrode RME4, respectively, that are not directly connected to the third conductive layer. The fourth connection electrode CNE4 may be a third-type connection electrode that is not in contact with the electrodes RME_2.

As described above, the plurality of light-emitting diodes ED may be sorted into different light-emitting diodes ED by the connection electrodes CNE_2 which their both ends are in contact with, in accordance with the arrangement structure of the connection electrodes CNE_2.

The first ends of the first light-emitting diodes ED1 may be in contact with the first connection electrode CNE1 while the second ends thereof may be in contact with the first extended portion CN_E1 of the third connection electrode CNE3. The first ends of the second light-emitting diodes ED2 may be in contact with the sixth extended portion CN_E6 of the fifth connection electrode CNE5 while the second ends thereof may be in contact with the second connection electrode CNE2. The first ends of the third light-emitting diodes ED3 may be in contact with the second extended portion CN_E2 of the third connection electrode CNE3 while the second ends thereof may be in contact with the third extended portion CN_E3 of the fourth connection electrode CNE4. The first ends of the fourth light-emitting diodes ED4 may be in contact with the fourth extended portion CN_E4 of the fourth connection electrode CNE4 while the second ends thereof may be in contact with the fifth extended portion CN_E5 of the fifth connection electrode CNE5.

The first ends of the first light-emitting diodes ED1 may be electrically connected to the first electrode RME1 connected directly to the third conductive layer, and the second ends of the second light-emitting diodes ED2 may be electrically connected to the second electrode RME2 connected directly to the third conductive layer. The first light-emitting diodes ED1 and the third light-emitting diodes ED3 may be electrically connected with each other through the third connection electrode CNE3, the third light-emitting diodes ED3 and the fourth light-emitting diodes ED4 may be electrically connected with each other through the fourth connection electrode CNE4, and the fourth light-emitting diodes ED4 and the second light-emitting diodes ED2 may be electrically connected with each other through the fifth connection electrode CNE5. The first light-emitting diodes ED1, the third light-emitting diodes ED3, the fourth light-emitting diodes ED4, and the second light-emitting diodes ED2 may be connected in series with one another through a plurality of connection electrodes CNE_2. According to the embodiment of FIG. 12, the display device 10_2 includes a greater number of light-emitting diodes ED for each of the sub-pixels SPXn to form the serial connection, thereby further increasing the amount of emitted light per unit area.

As the light-emitting diodes ED disposed in each sub-pixel SPXn are sorted into different light-emitting diodes ED, the second insulating layer PAS2_2 may include a greater number of pattern portions PT1, PT2, PT3, and PT4. In accordance with it, the second insulating layer PAS2_2 may include a greater number of bridge portions BR1, BR2, BR3, BR4, and BR5 as a structure that can prevent the delamination of the pattern portions PT1, PT2, PT3, and PT4.

Figure 15:
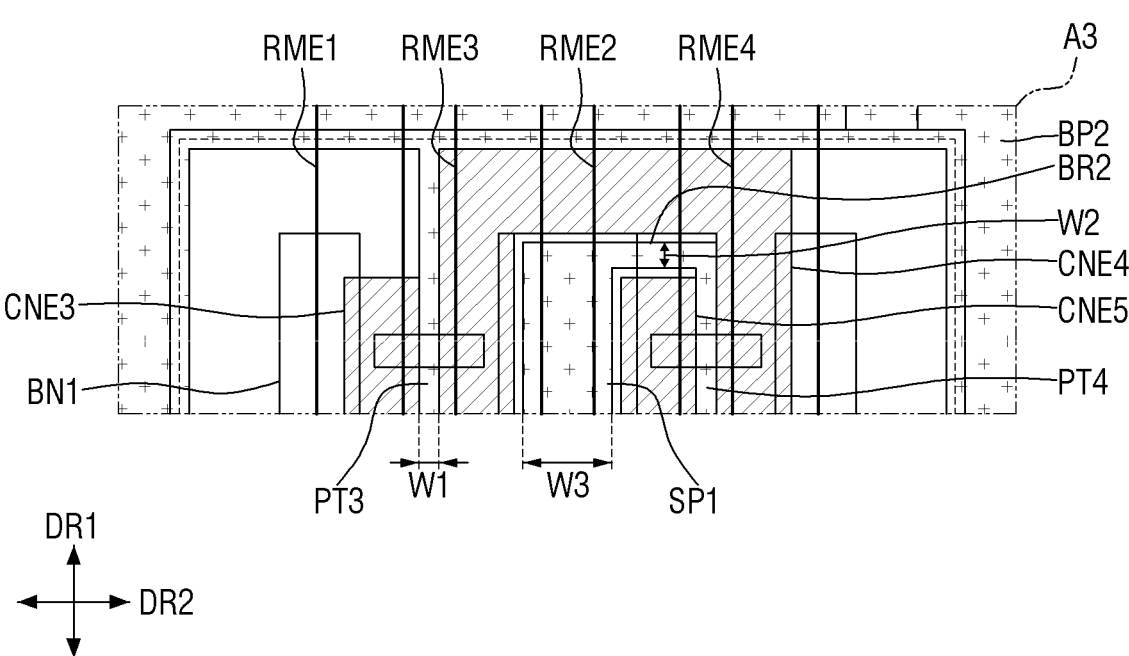
FIG. 15 is an enlarged view of a portion A3 of FIG. 12.
Figure 16:
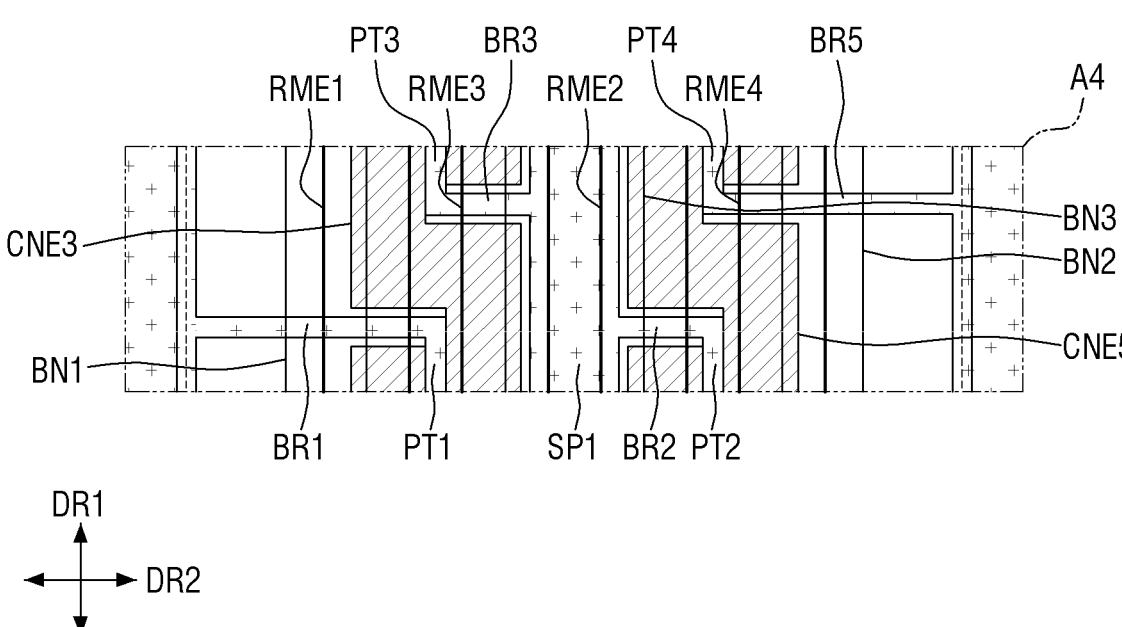
FIG. 16 is an enlarged view of a portion A4 of FIG. 12.
Figure 17:
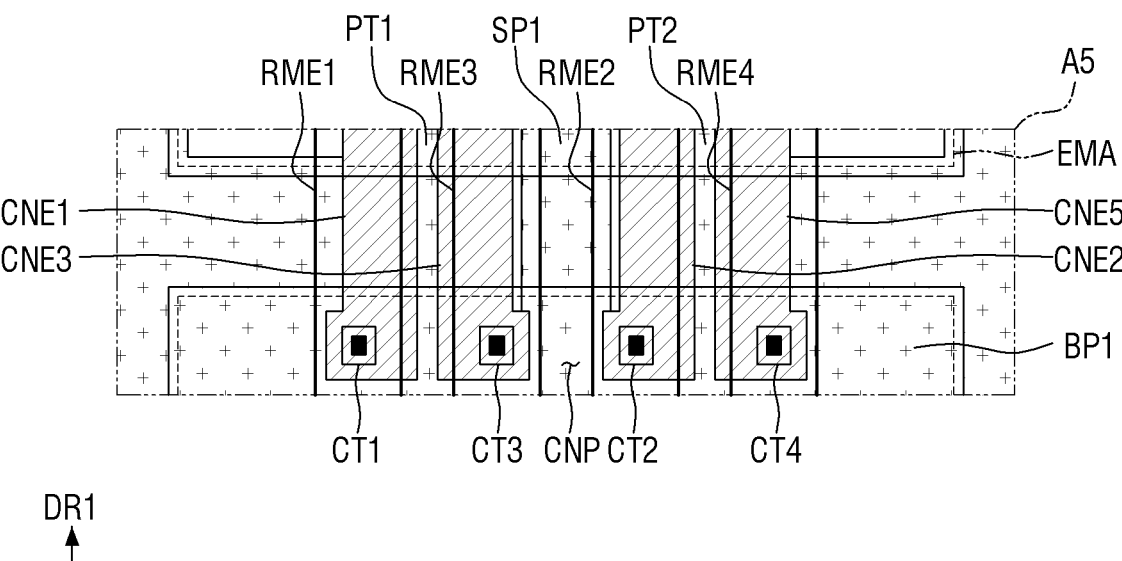
FIG. 17 is an enlarged view of a portion A5 of FIG. 12.

Referring to FIG. 15, one of the first pattern portions PT1 may be connected to the pattern portion disposed on second bank BNL2, and they may be surrounded by connection electrodes. FIG. 17 is an enlarged view of a portion A5 of FIG. 12. FIGS. 15-17 show portions in which different pattern portions PT1, PT2, PT3, and PT4 of the second insulating layer PAS2_2 are connected to the base portions BP1 and BP2 or the bridge portions.

Referring to FIGS. 15-17 in conjunction with FIGS. 12-14, the second insulating layer PAS2_2 may include the first pattern portion PT1 disposed on first light-emitting diodes ED1, the second pattern portion PT2 disposed on second light-emitting diodes ED2, the third pattern portion PT3 disposed on third light-emitting diodes ED3, and the fourth pattern portion PT4 disposed on fourth light-emitting diodes ED4.

The first pattern portion PT1 and the third pattern portion PT3 may be disposed between the first bank portion BN1 and the third bank portion BN3, and may be spaced from each other in the first direction DR1 with a first bridge portion CN_B1 of a third connection electrode CNE3 interposed therebetween. The first pattern portion PT1 and the third pattern portion PT3 may be in contact with the first bridge portion CN_B1. One side of the first pattern portion PT1 in the first direction DR1 may be connected to the first base portion BP1 beyond the second bank BNL2, and the opposite side of the third pattern portion PT3 in the first direction DR1 may be connected to the second base portion BP2 disposed on the second bank BNL2.

The second pattern portion PT2 and the fourth pattern portion PT4 may be disposed between the third bank portion BN3 and the second bank portion BN2, and may be spaced from each other in the first direction DR1 with a third bridge portion CN_B3 of a fifth connection electrode CNE5 therebetween. The second pattern portion PT2 and the fourth pattern portion PT4 may be in contact with the third bridge portion CN_B3. One side of the second pattern portion PT2 in the first direction DR1 may be connected to the first base portion BP1 beyond the second bank BNL2, and the opposite side of the fourth pattern portion PT4 in the first direction DR1 may be connected to the second base portion BP2 disposed on the second bank BNL2.

The first support pattern portion SP1 is disposed on the third bank portion pattern BN3, similarly to the embodiment of FIG. 9. The first support pattern portion SP1 may partially overlap with each of the second electrode RME2 and the third electrode RME3. The first support pattern portion SP1 may be extended in the first direction DR1 and may be connected to a connection pattern CNP (see, for example, FIG. 7) of the first base portion BP1 disposed in the subsidiary area SA.

The second insulating layer PAS2_2 may include the plurality of bridge portions connecting the pattern portions PT1, PT2, PT3, and PT4 with the second base portion BP2 or the first support pattern portion SP1.

The first bridge portion BR1 may be connected to the first pattern portion PT1 and a part of the second base portion BP2 extended in the first direction DR1. The first bridge portion BR1 may be disposed between the first connection electrode CNE1 and the second extended portion CN_E2 of the third connection electrode CNE3 and may have a shape extended in the second direction DR2. The first bridge portion BR1 may be spaced from the first connection electrode CNE1 and the third connection electrode CNE3. The second bridge portion BR2 may be connected to the second pattern portion PT2 and the first support pattern portion SP1. The second bridge portion BR1 may be disposed between the second connection electrode CNE2 and the fifth extended portion CN_E5 of the fifth connection electrode CNE5 and may have a shape extended in the second direction DR2. The second bridge portion BR2 may be spaced from the second connection electrode CNE2 and the fifth connection electrode CNE5 in the first direction DR1.

The third bridge portion BR3 may be connected to the third pattern portion PT3 and the first support pattern portion SP1. The third bridge portion BR3 may be disposed between the first extended portion CN_E1 of the third connection electrode CNE3 and the third extended portion CN_E3 of the fourth connection electrode CNE4 and may have a shape extended in the second direction DR2. The third bridge portion BR3 may be spaced from the third connection electrode CNE3 and the fourth connection electrode CNE4. The fourth bridge portion BR4 may be connected to the fourth pattern portion PT4 and the first support pattern portion SP1. The fourth bridge portion BR4 may be disposed between the second bridge portion CN_B2 of the fourth connection electrode CNE4 and the fifth extended portion CN_E5 of the fifth connection electrode CNE5 and may have a shape extended in the second direction DR2. The fourth bridge portion BR4 may be spaced from the fourth connection electrode CNE4 and the fifth connection electrode CNE5.

The fifth bridge portion BR5 may be connected to the fourth pattern portion PT4 and a part of the second base portion BP2 extended in the first direction DR1. The fifth bridge portion BR5 may be disposed between the fourth extended portion CN_E4 of the fourth connection electrode CNE4 and the sixth extended portion CN_E6 of the fifth connection electrode CNE5 and may have a shape extended in the second direction DR2. The fifth bridge portion BR5 may be spaced from the fourth connection electrode CNE4 and the fifth connection electrode CNE5.

As described above, the second insulating layer PAS2_2 is disposed so that it does not overlap with the connection electrodes CNE_2 in the thickness direction of the first substrate SUB. The pattern portions PT1, PT2, PT3, and PT4 of the second insulating layer PAS2_2 and the bridge portions BR1, BR2, BR3, BR4, and BR5 are connected with each other and thus are not delaminated. In addition, as described above, the plurality of bridge portions BR1, BR2, BR3, BR4, and BR5 may be in contact with the side surfaces of adjacent connection electrodes CNE_2 depending on process conditions of fabricating the connection electrodes CNE_2.

The second insulating layer PAS2_2 according to the embodiment of FIGS. 12-13 includes more electrodes RME_2 in each of the sub-pixels SPXn and thus more pattern portions, and may include more bridge portions in order to have a structure that can prevent the delamination.

On the other hand, as a structure that prevents the delamination of the plurality of pattern portions, the plurality of bridge portions may have a shape extended in the second direction DR2, and may be connected to the part of the second base portion BP2 extended in the first direction DR1. In some embodiments, if a pattern similar to the part of the second base portion BP2 extended in the first direction DR1 is disposed in the emission area EMA, the second base portion BP2 of the second insulating layer PAS2 may be eliminated. In such case, the pattern disposed in the emission area EMA may be connected to each of the pattern portions through the bridge portions, so that it is possible to prevent the delamination of the pattern portions.

Figure 18:
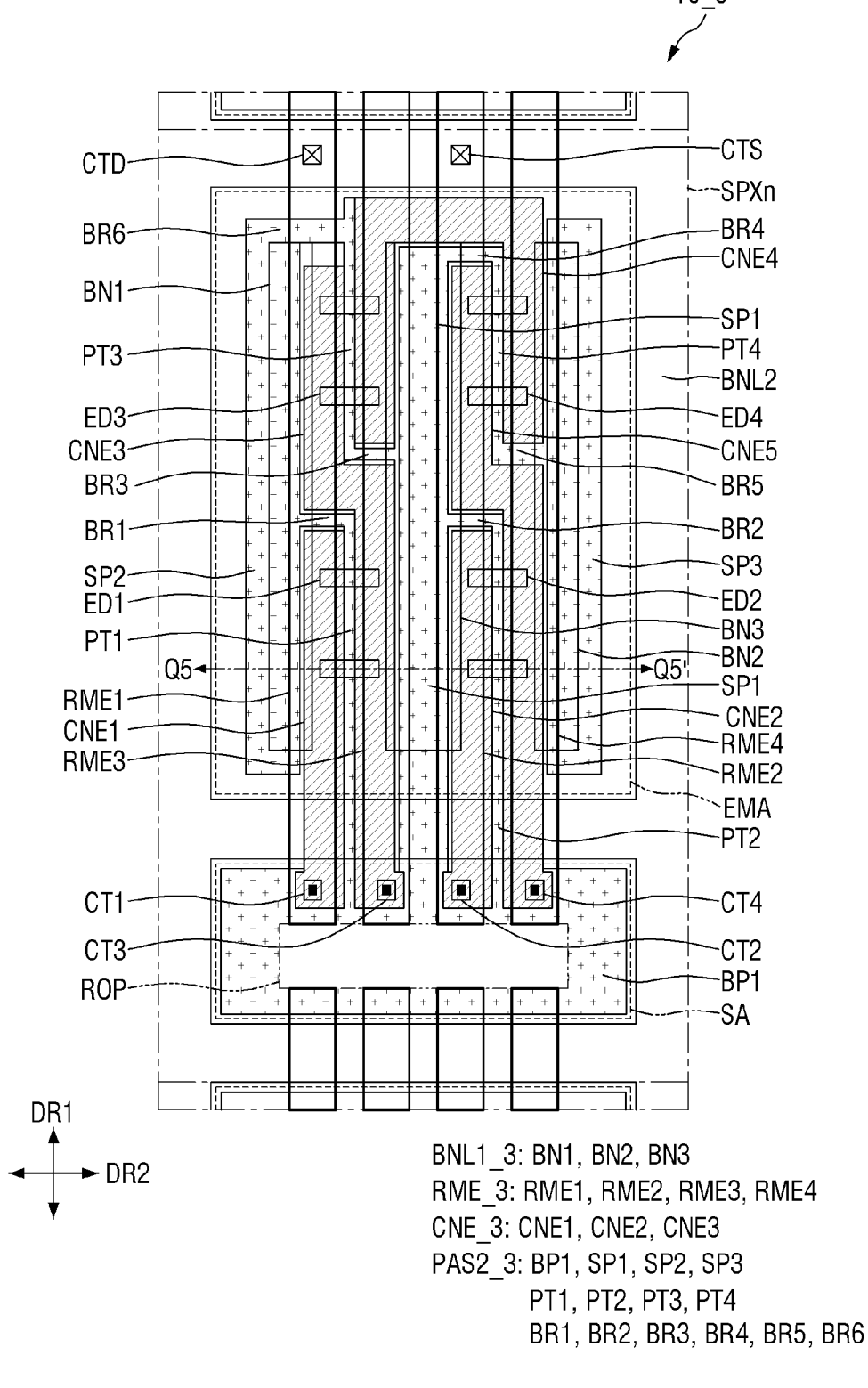
FIG. 18 is a plan view showing a sub-pixel of a display device according to an embodiment of the disclosure.
Figure 19:
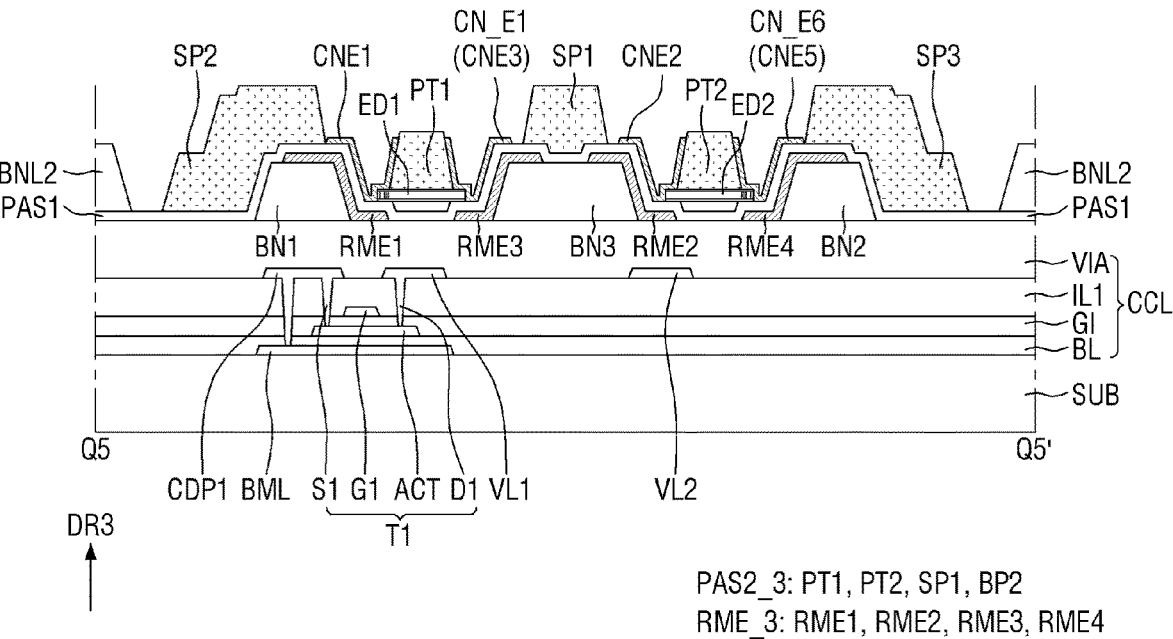
FIG. 19 is a cross-sectional view taken along the line Q5-Q5' of FIG. 18.

FIG. 18 is a plan view showing a sub-pixel of a display device according to an embodiment of the present disclosure. FIG. 19 is a cross-sectional view taken along the line Q5-Q5' of FIG. 18.

Referring to FIGS. 18 and 19, in a display device 10_3 according to an embodiment, a second base portion BP2 of a second insulating layer PAS2_3 may be eliminated and the second insulating layer PAS2_3 may include more support patterns SP1, SP2 and SP3. A plurality of bridge portions connecting the pattern portions PT1, PT2, PT3, and PT4 with the second base portion BP2 in previous embodiments, may be connected to one of the plurality of support patterns SP1, SP2 and SP3. This embodiment is different from the embodiment of FIG. 12 in that the second base portion BP2 of the second insulating layer PAS2_3 is replaced with the plurality of support patterns SP1, SP2 and SP3. In the following description, descriptions will focus on the difference, and the redundant descriptions will be omitted.

According to an embodiment of the present disclosure, in addition to a first support pattern portion SP1, the second insulating layer PAS2_3 may further include a second support pattern portion SP2 and a third support pattern portion SP3 that are spaced from the first support pattern portion SP1 in the second direction DR2 and disposed in the emission area EMA. While the first support pattern portion SP1 is disposed on the third bank portion BN3, the second support pattern portion SP2 may be disposed on a part of the first bank portion BN1 and the third support pattern portion SP3 may be disposed on a part of the second bank portion BN2. The second support pattern portion SP2 and the third support pattern portion SP3 have a third width W3 that is equal to the width of the first support pattern portion SP1 (see, for example, FIG. 11) and are extended in the first direction DR1. The second support pattern portion SP2 and the third support pattern portion SP3 may be spaced from each other in the second direction DR2, with the first support pattern portion SP1 interposed therebetween.

The second support pattern portion SP2 may partially overlap with the first bank portion BN1 and the first electrode RME1. The second support pattern portion SP2 may be spaced from or in contact with a second extended portion CN_E2 of the third connection electrode CNE3 and the first connection electrode CNE1, and may be connected to the first pattern portion PT1 and the third pattern portion PT3 through the bridge portions. For example, the first pattern portion PT1 may be connected to the second support pattern portion SP2 through the first bridge portion BR1 and the third pattern portion PT3 may be connected to the second support pattern portion SP2 through the sixth bridge portion BR6. The first pattern portion PT1 may be connected to the first base portion BP1 beyond the second bank portion BNL2 and at the same time, may be connected to the first bridge portion BR1 and the second support pattern portion SP2. On the other hand, because the second base portion BP2 is eliminated, the third pattern portion PT3 may be connected to the first support pattern portion SP1 and the second support pattern portion SP2 through the third bridge portion BR3 and the sixth bridge portion BR6, respectively.

The third support pattern portion SP3 may partially overlap with the second bank portion BN2 and the fourth electrode RME4. The third support pattern portion SP3 may be spaced from or in contact with a fourth extended portion CN_E4 of the fourth connection electrode CNE4 and a sixth extended portion CN_E6 of the fifth connection electrode CNE5, and may be connected to the fourth pattern portion PT4 through the fifth bridge portion BR5.

In the display device 10_3 according to the embodiment of FIGS. 18 and 19, because the second base portion BP2 of the second insulating layer PAS2_3 disposed on the second bank BNL2 is eliminated, level differences between the inner regions of the sub-pixels SPXn and the boundary regions of the sub-pixels SPXn can be reduced.

Figure 20:
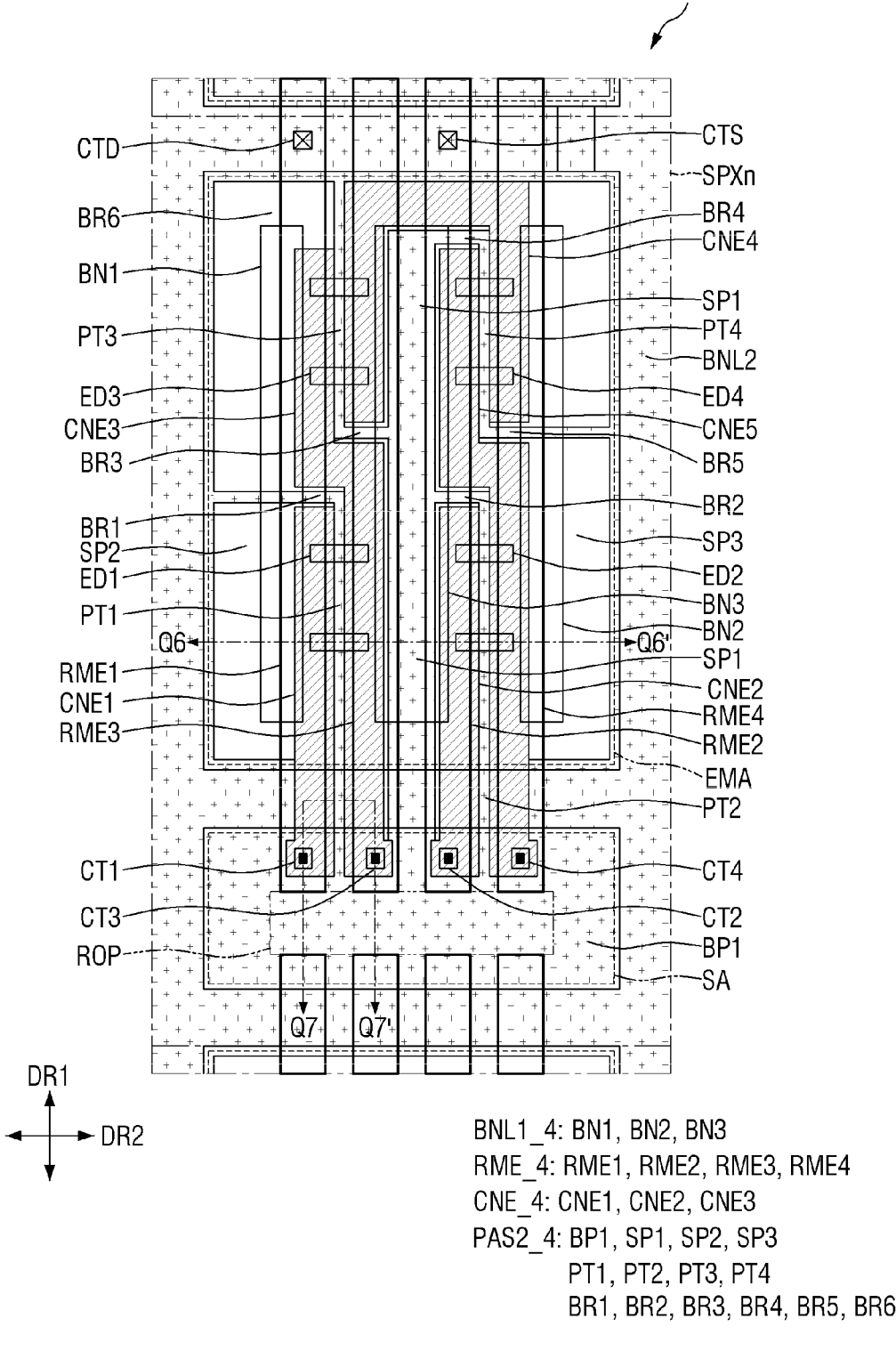
FIG. 20 is a plan view showing a sub-pixel of a display device according to an embodiment of the disclosure.
Figure 21:
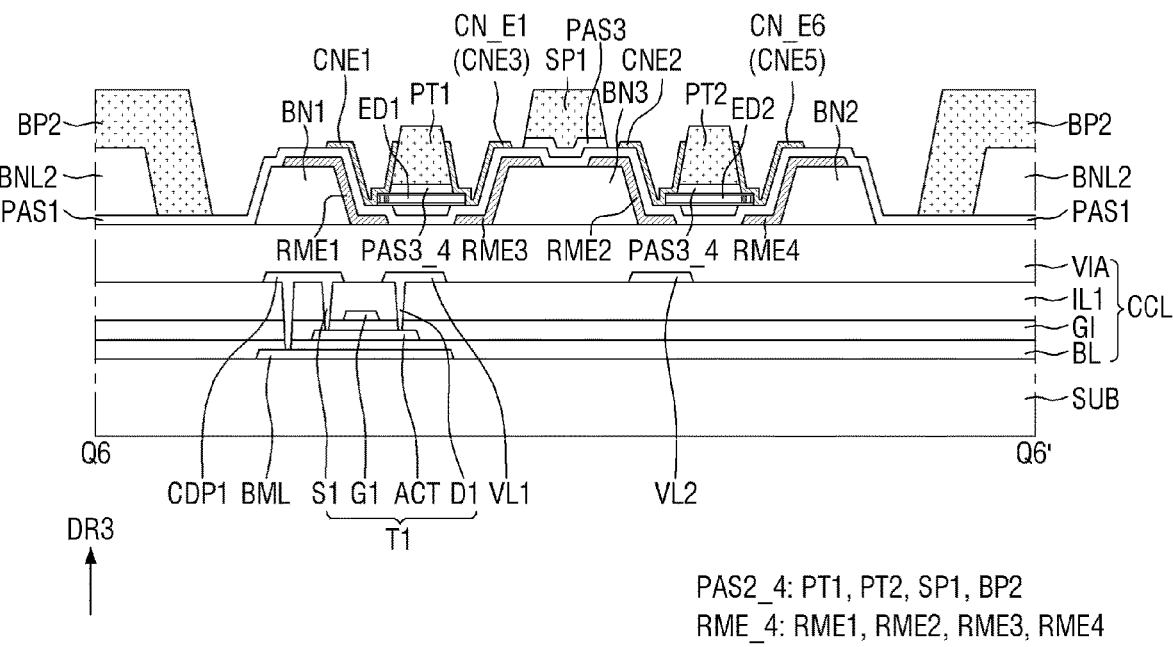
FIG. 21 is a cross-sectional view taken along the line Q6-Q6' of FIG. 20.
Figure 22:
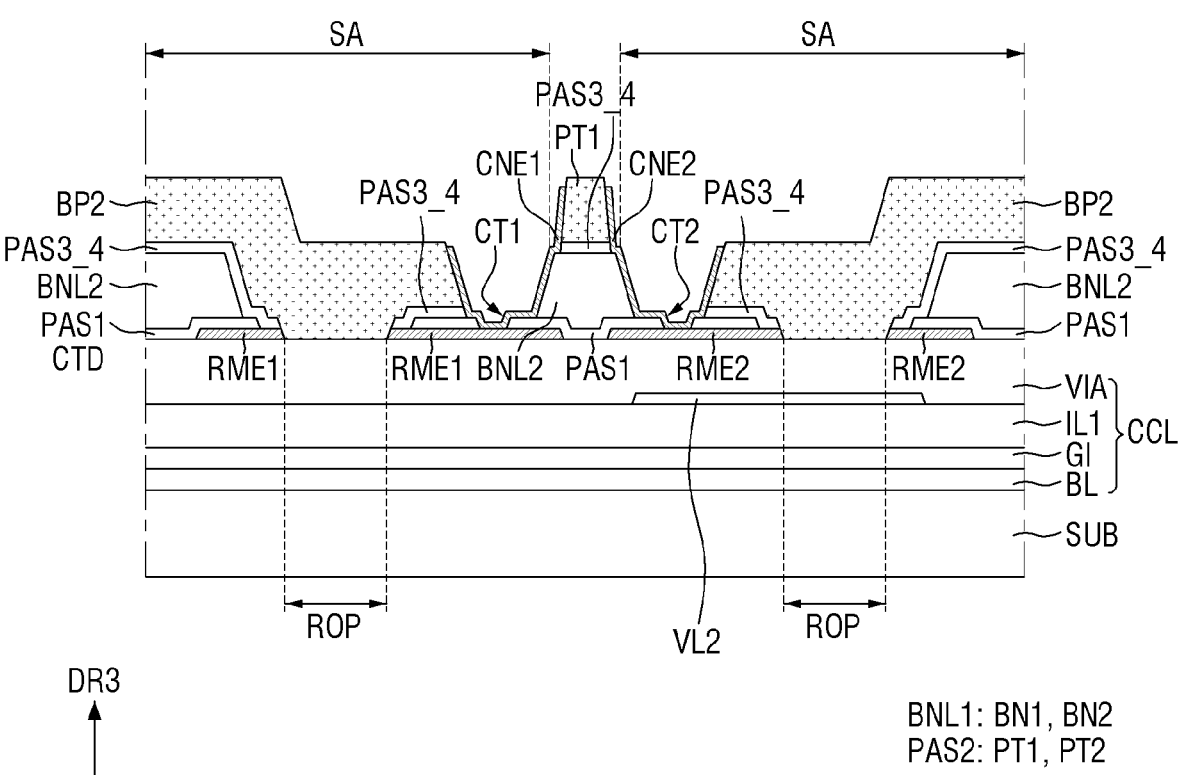
FIG. 22 is a cross-sectional view taken along the line Q7-Q7' of FIG. 20.

FIG. 20 is a plan view showing a sub-pixel of a display device according to another embodiment of the present disclosure. FIG. 21 is a cross-sectional view taken along the line Q6-Q6' of FIG. 20. FIG. 22 is a cross-sectional view taken along the line Q7-Q7' of FIG. 20. FIG. 21 shows a cross section passing through an emission area EMA of one sub-pixel SPXn. FIG. 22 shows a cross section passing through a separation region ROP of a subsidiary area SA.

Referring to FIGS. 20-22, a display device 10_4 according to an embodiment may further include a third passivation layer PAS3_4 disposed between pattern portions PT1, PT2, PT3, and PT4 of a second insulating layer PAS2_4 and light-emitting diodes ED. The third passivation layer PAS3_4 may be formed before the second insulating layer PAS2_4 to fix the light-emitting diodes ED. The second insulating layer PAS2_4 may be formed after a process of separating a plurality of electrodes RME at the separation region ROP. Accordingly, the first base portion BP1 of the second insulating layer PAS2_4 may be disposed on the entire surface of the subsidiary area SA including the separation region ROP.

The third passivation layer PAS3_4 may be disposed under the pattern portions PT1, PT2, PT3, and PT4 of the second insulating layer PAS2_4 and may have substantially the same shape. In some embodiments, the third passivation layer PAS3_4 may have a shape extended in the first direction DR1 between the bank portions BN1, BN2, and BN3, and may cover the plurality of light-emitting diodes ED. The both side surfaces of the third passivation layer PAS3_4 may be aligned with the both side surfaces of the pattern portions PT1, PT2, PT3, and PT4 of the second insulating layer PAS2_4, respectively. The third passivation layer PAS3_4 may be formed by applying an insulating material onto the plurality of light-emitting diodes ED to cover them, and then by patterning it during the same process as the second insulating layer PAS2_4. As a result, the pattern shape of the third passivation layer PAS3_4 may be substantially identical to the that of the second insulating layer PAS2_4 in the plan and cross-sectional views.

According to the embodiment of FIGS. 20-22 of the present disclosure, the third passivation layer PAS3_4 may include an inorganic insulating material unlike the second insulating layer PAS2_4. The third passivation layer PAS3_4 may be made of a material that is more similar to that of the first passivation layer PAS1 than that of the second insulating layer PAS2_4, and may surround the light-emitting diodes ED to fix and protect them.

On the other hand, the electrodes RME in different sub-pixels SPXn adjacent to each other in the first direction DR1 may be spaced from each other at the separation region ROP in the subsidiary area SA. The electrodes spaced from each other in the first direction DR1 may be formed by forming a single electrode line and then separating it into parts after the process of aligning the light-emitting diodes ED. The process of separating the electrode line may be performed after the third passivation layer PAS3_4 has been formed, and the second insulating layer PAS2_4 may be formed after the separation process. Accordingly, the first passivation layer PAS1 and the third passivation layer PAS3_4 are not disposed in the separation region ROP of the subsidiary area SA, and the via layer VIA exposed by the electrodes RME that are spaced from one another may be covered by the first base portion BP1 of the second insulating layer PAS2_4. The third passivation layer PAS3_4 may be utilized as a mask pattern during the process of separating the electrode lines.

Because the first base portion BP1 covers the separation region ROP of the subsidiary area SA, the level difference by the first base portion BP1 in the subsidiary area SA can be reduced. The first base portion BP1 is disposed to cover the subsidiary area SA entirely except for the regions in which the plurality of connection electrodes CNE and the contacts CT1, CT2, CT3, and CT4 are formed. For example, the first base portion BP1 covers the separation region ROP adjacent to the contacts CT1, CT2, CT3, and CT4, thereby reducing level differences around than the contacts. By doing so, it is possible to prevent material residues from remaining due to the level differences formed by the separation region ROP adjacent thereto when the connection electrodes CNE are formed on the contacts.

In the above-described embodiments, each of the bank portions BN1, BN2, and BN3 of the first bank BNL1 may have a length measured in the first direction DR1 that is shorter than the emission area EMA. However, in some embodiments, each of the bank portions BN1, BN2, and BN3 may have a length in the first direction DR1 that is longer than the emission area EMA and may overlap with the portion of the second bank BNL2 extended in the second direction DR2.

Figure 23:
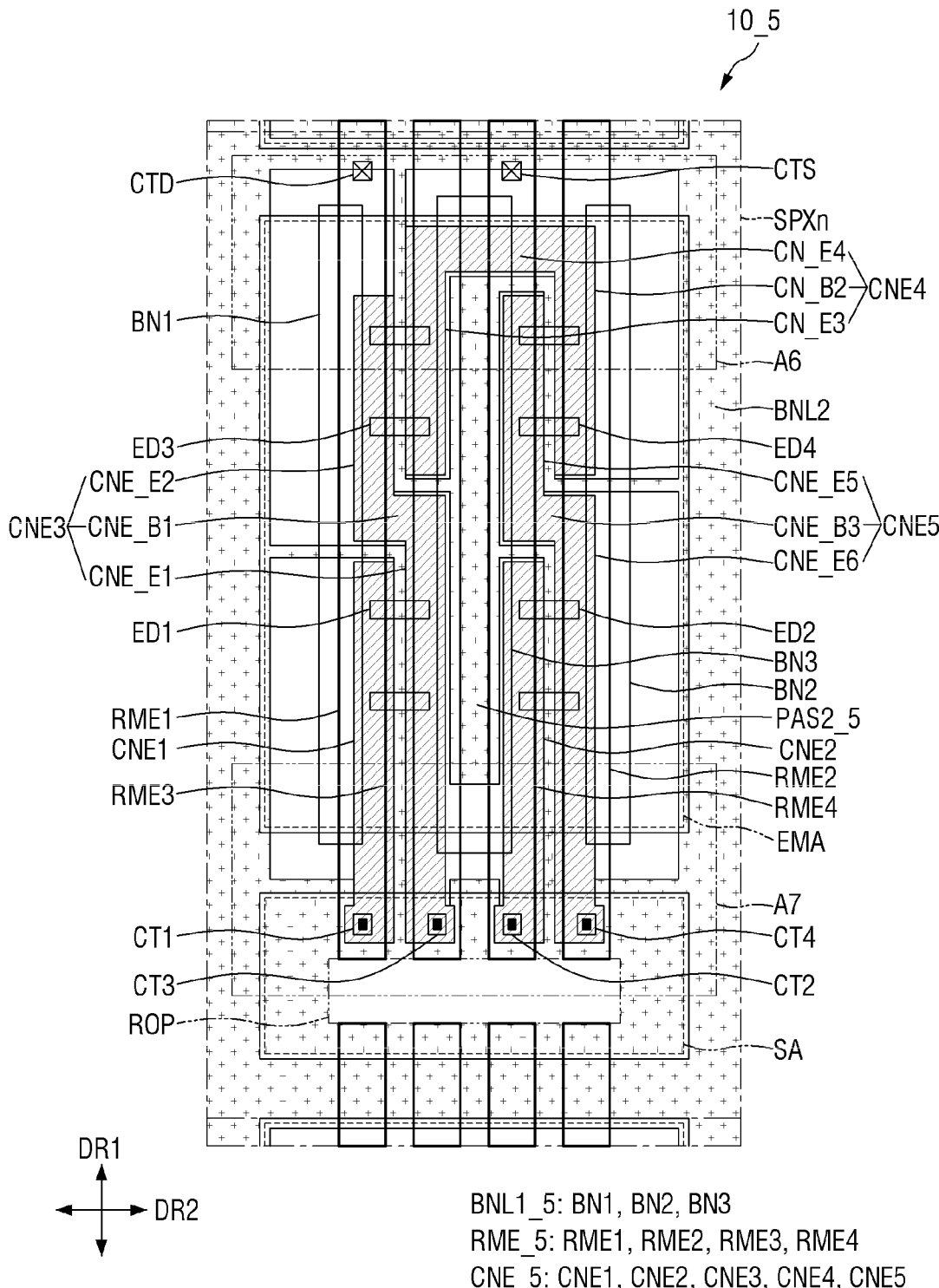
FIG. 23 is a plan view showing a sub-pixel of a display device according to an embodiment of the disclosure.
Figure 24:
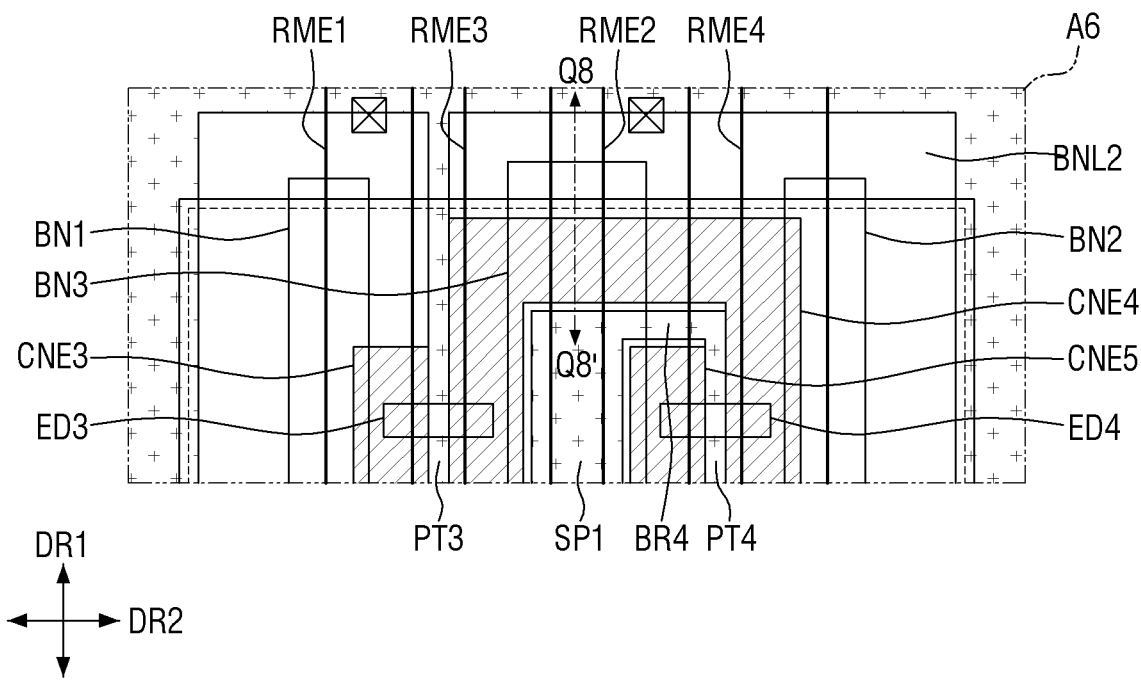
FIG. 24 is an enlarged view of a portion A6 of FIG. 23.
Figure 25:
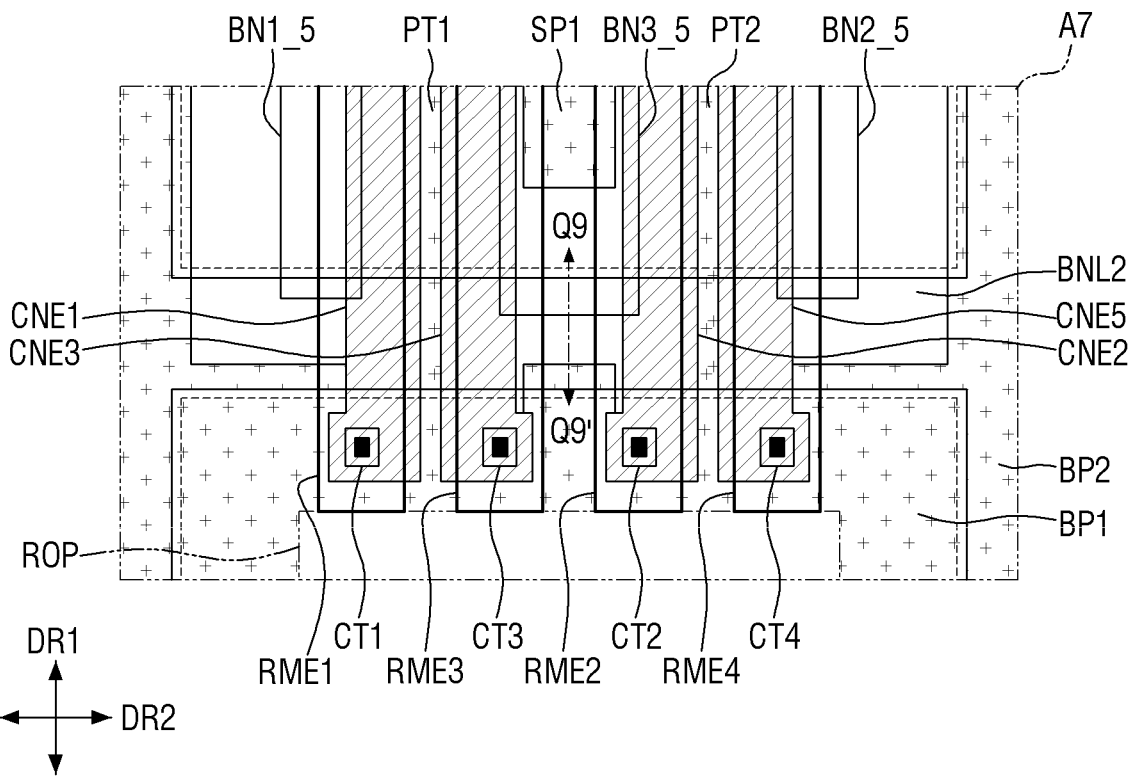
FIG. 25 is an enlarged view of a portion A7 of FIG. 23.
Figure 26:
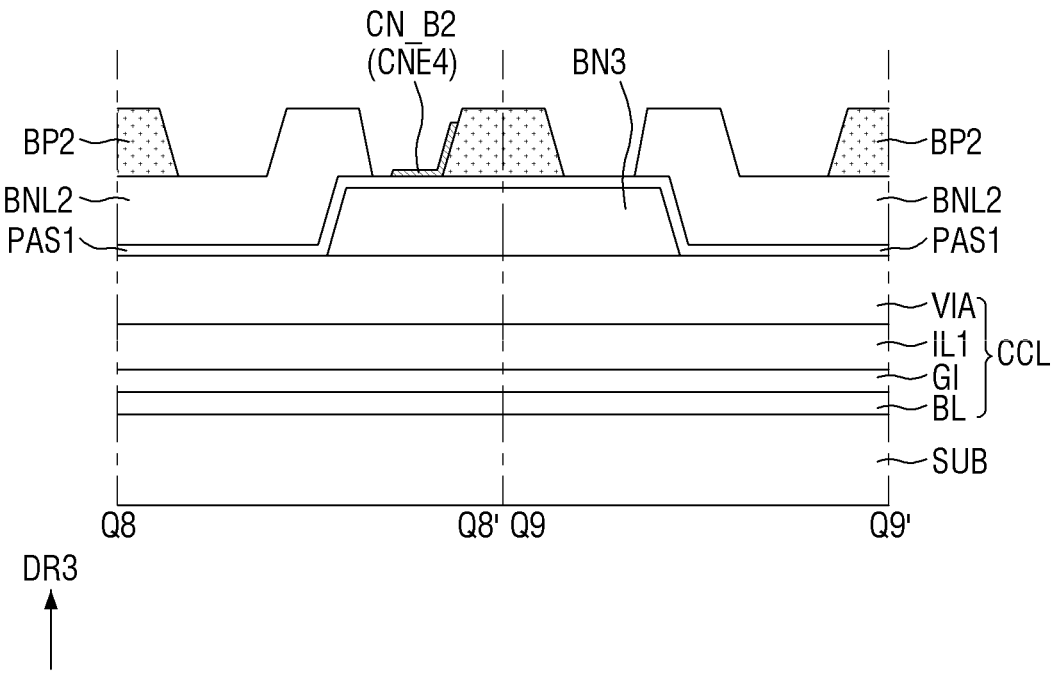
FIG. 26 is a cross-sectional view taken along the line Q8-Q8' of FIG. 24 and the line Q9-Q9' of FIG. 25.

FIG. 23 is a plan view showing a sub-pixel of a display device according to an embodiment of the present disclosure. FIG. 24 is an enlarged view of a portion A6 of FIG. 23. FIG. 25 is an enlarged view of a portion A7 of FIG. 23. FIG. 26 is a cross-sectional view taken along the line Q8-Q8' of FIG. 24 and line Q9-Q9' of FIG. 25. FIG. 24 shows parts of the second bank BNL2 and the first bank BNL1 located on the upper side of the emission area EMA. FIG. 25 shows parts of the second bank BNL2 and the first bank BNL1 located on the lower side of the emission area EMA.

Referring to FIGS. 23-26, in the display device 10_5 according to an embodiment, a plurality of bank portions BN1, BN2, and BN3 of a first bank BNL1_5 may be longer than the emission area EMA in the first direction DR1. Portions of the second bank BNL2 extended in the second direction DR2 may partially overlap with each of the bank portions BN1, BN2, and BN3, the portions where they overlap each other may be higher than the other portions from the upper surface of the via layer VIA. The connection electrodes CNE may be extended from the bank portions BN1, BN2, and BN3 in the first direction DR1 to be disposed in the subsidiary area SA. As the bank portions BN1, BN2, and BN3 partially overlap with the second bank BNL2 between the emission area EMA and the subsidiary area SA, the level difference between the portions of the emission area EMA where the connection electrodes CNE are disposed and the second bank BNL2 can be reduced. By doing so, it is possible to prevent material residues from remaining on the second bank BNL2 during the process of forming the connection electrodes CNE.

However, the portions where the bank portions BN1, BN2, and BN3 of the first bank BNL1 and the second bank BNL2 overlap one another may be higher than the other portions, and thus there may be very large level differences between them. The second insulating layer PAS2_5 includes a second base portion BP2 disposed on the second bank BNL2. If the second base portion BP2 overlaps with the bank portions BN1, BN2, and BN3 of the first bank BNL1 and the second bank BNL2, the level differences may become even larger. In order to avoid this, the second base portion BP2 of the second insulating layer PAS2_5 may not be disposed where the bank portions BN1, BN2, and BN3 of the first bank BNL1 and the second bank BNL2 overlap one another.

In concluding the detailed description, those skilled in the art will appreciate that many variations and modifications may be made to the embodiments without substantially departing from the spirit or scope of the present disclosure. Therefore, the embodiments of the present disclosure are used in a generic and descriptive sense only and not for purposes of limitation.

What is claimed is:

1. A display device comprising:

an emission area and a subsidiary area spaced from the emission area in a first direction;

a first electrode in the emission area and extending in the first direction, and a second electrode spaced from the first electrode in a second direction crossing the first direction, the second electrode extending in the first direction;

a first insulating layer on the first electrode and the second electrode;

a plurality of light-emitting elements on the first insulating layer and having at least one end on the first electrode or the second electrode;

a second insulating layer on the plurality of light-emitting elements and comprising a first pattern portion extending in the first direction and a first base portion in the subsidiary area;

a first connection electrode on the first electrode and in contact with the light-emitting elements, and a second connection electrode on the second electrode and in contact with the light-emitting elements, a third electrode between the first electrode and the second electrode;

a fourth electrode spaced from the second electrode in the second direction;

a third connection electrode located across the first electrode and the third electrode;

a fourth connection electrode located across the third electrode and the fourth electrode; and a fifth connection electrode located across the fourth electrode and the second electrode, wherein the first pattern portion extends from the emission area to the subsidiary area and connected to the first base portion, wherein the plurality of light-emitting elements comprises:

first light-emitting elements on the first electrode and the third electrode and in contact with the first connection electrode and the third connection electrode;

second light-emitting elements on the second electrode and the fourth electrode and in contact with the second connection electrode and the fifth connection electrode;

third light-emitting elements on the first electrode and the third electrode and in contact with the third connection electrode and the fourth connection electrode; and fourth light-emitting elements on the second electrode and the fourth electrode and in contact with the fourth connection electrode and the fifth connection electrode.

2. The display device of claim 1, wherein the first pattern portion of the second insulating layer is on the first light-emitting elements, and wherein the second insulating layer further comprises:

a second pattern portion on the second light-emitting elements;

a third pattern portion on the third light-emitting elements;

a fourth pattern portion on the fourth light-emitting elements;

a first support pattern portion partially overlapping the second electrode and the third electrode and extending in the first direction; and a plurality of bridge portions extending in the second direction and connected to the first support pattern portion and one of the first, second, third, and fourth pattern portions.

3. The display device of claim 2, wherein the plurality of bridge portions comprises:

a second bridge portion connecting the second pattern portion with the first support pattern portion;

a third bridge portion connecting the third pattern portion with the first support pattern portion; and a fourth bridge portion connecting the fourth pattern portion with the first support pattern portion.

4. The display device of claim 2, wherein the second insulating layer further comprises a second support pattern portion and a third support pattern portion extended in the first direction within the emission area and spaced from each other in the second direction with the first support pattern portion therebetween, wherein the plurality of bridge portions comprises a first bridge portion connected to the first pattern portion and the second support pattern portion;

wherein a fifth bridge portion connected to the fourth pattern portion and the third support pattern portion; and wherein a sixth bridge portion connected to the third pattern portion and the second support pattern portion.

5. A display device comprising:

a plurality of electrodes extending in a first direction and spaced from each other in a second direction crossing the first direction, the plurality of electrodes comprising: a first electrode, a second electrode spaced from the first electrode in the second direction, a third electrode between the first electrode and the second electrode, and a fourth electrode spaced from the second electrode in the second direction;

a first insulating layer on the plurality of electrodes;

a plurality of first light-emitting elements having both ends on the first electrode and the third electrode and arranged along the first direction, and a plurality of second light-emitting elements having both ends on the second electrode and the fourth electrode, and arranged along the first direction; and a second insulating layer comprising a first pattern portion on the first light-emitting elements and extending in the first direction, a second pattern portion on the second light-emitting elements and extending in the first direction, and a first support pattern portion partially located on the second electrode and the third electrode and extending in the first direction, wherein the second insulating layer comprises a plurality of bridge portions extending in the second direction and connected to at least one of the first pattern portion, the second pattern portion, and the first support pattern portion.

6. The display device of claim 5, wherein a first width of the first pattern portion and the second pattern portion measured in the second direction is smaller than lengths of the plurality of first light-emitting elements and the plurality of second light-emitting elements, wherein a second width of the plurality of bridge portions measured in the first direction is greater than the first width of the first pattern portion and the second pattern portion, and wherein a third width of the first support pattern portion measured in the second direction is greater than the second width of the plurality of bridge portions measured in the first direction.

7. The display device of claim 6, wherein a thickness of the first pattern portion and the second pattern portion is greater than the first width of the first pattern portion and the second pattern portion.

8. The display device of claim 5, further comprising:

a first bank overlapping the plurality of electrodes and comprising a plurality of bank portions extending in the first direction; and a second bank surrounding an emission area, the plurality of first and second light-emitting elements being located in the emission area, and a subsidiary area being spaced from the emission area in the first direction, wherein the second insulating layer further comprises a first base portion in the subsidiary area and a second base portion on the second bank, and wherein each of the first pattern portion and the second pattern portion is extends from the emission area to the subsidiary area and is connected to the first base portion.

9. The display device of claim 8, wherein the second insulating layer further comprises a first bridge portion extending in the second direction and connected to the first pattern portion and the second base portion.

10. The display device of claim 5, wherein the second insulating layer further comprises a third pattern portion spaced from the first pattern portion in the first direction;

a fourth pattern portion spaced from the second pattern portion in the first direction; and a second support pattern portion and a third support pattern portion extending in the first direction and spaced from each other in the second direction with the first support pattern portion therebetween, and the plurality of bridge portions comprises a first bridge portion connected to the first pattern portion and the second support pattern portion;

a second bridge portion connected to the second pattern portion and the first support pattern portion;

a third bridge portion connected to the third pattern portion and the first support pattern portion; and a fourth bridge portion connected to the fourth pattern portion and the first support pattern portion.

11. The display device of claim 10, wherein the plurality of bridge portions further comprises:

a fifth bridge portion connected to the fourth pattern portion and the third support pattern portion; and a sixth bridge portion connected to the third pattern portion and the second support pattern portion.

* * * * *